United States Patent
Kim et al.

(10) Patent No.: US 9,029,252 B2
(45) Date of Patent: May 12, 2015

(54) NANOSTRUCTURE, OPTICAL DEVICE INCLUDING THE SAME, AND METHODS OF MANUFACTURING THE NANOSTRUCTURE AND THE OPTICAL DEVICE

(71) Applicants: Samsung Electronics Co., Ltd., Suwon-si (KR); Unist Academy—Industry Research Corporation, Ulsan (KR)

(72) Inventors: Un-jeong Kim, Hwaseong-si (KR); Jin-eun Kim, Suwon-si (KR); Young-geun Roh, Seoul (KR); Soo-jin Park, Ulsan (KR); Yeon-sang Park, Seoul (KR); Seung-min Yoo, Ulsan (KR); Chang-won Lee, Hwaseong-si (KR); Jae-soong Lee, Suwon-si (KR); Sang-mo Cheon, Bucheon-si (KR)

(73) Assignees: Samsung Electronics Co., Ltd., Suwon-si (KR); Unist Academy—Industry Research Corporation, Ulsan (KR)

( * ) Notice: Subject to any disclaimer, the term of this patent is extended or adjusted under 35 U.S.C. 154(b) by 0 days.

(21) Appl. No.: 14/178,566

(22) Filed: Feb. 12, 2014

(65) Prior Publication Data

US 2014/0225067 A1 Aug. 14, 2014

(30) Foreign Application Priority Data

Feb. 14, 2013 (KR) ........................ 10-2013-0016058

(51) Int. Cl.
*H01L 21/22* (2006.01)
*H01L 21/38* (2006.01)
(Continued)

(52) U.S. Cl.
CPC ...... *H01L 31/022416* (2013.01); *H01L 21/283* (2013.01); *H01L 31/028* (2013.01); *Y10S 977/954* (2013.01)

(58) Field of Classification Search
USPC ............. 257/E21.027, E21.011, E21.29, 428; 438/553, 623, 945; 977/954
See application file for complete search history.

(56) References Cited

U.S. PATENT DOCUMENTS 8,268,180 B2 * 9/2012 Arnold et al. ................... 216/56
8,580,658 B1 * 11/2013 Davis ........................... 438/478
(Continued)

FOREIGN PATENT DOCUMENTS

| KR | 10-2011-0032999 A | 3/2011 |
|----|-------------------|--------|
| KR | 10-2011-0138186 A | 12/2011 |
| KR | 10-1237990 B1 | 2/2013 |

OTHER PUBLICATIONS

Liu, Yuan et al., "Plasmon resonance enhanced multicolour photodetection by graphene", Nature Communications 2, No. 579, Dec. 6, 2011, Abstract (2 Pages).
(Continued)

*Primary Examiner* — Evan Pert
*Assistant Examiner* — Gustavo Ramallo
(74) *Attorney, Agent, or Firm* — Sughrue Mion, PLLC

(57) ABSTRACT

A nanostructure, an optical device including the nanostructure, and methods of manufacturing the nanostructure and the optical device. A method of manufacturing a nanostructure may include forming a block copolymer template layer and a precursor pattern of metal coupled to the block copolymer template layer on a graphene layer, and forming a metal nanopattern on the graphene layer by removing the block copolymer template layer and reducing the precursor pattern.

31 Claims, 26 Drawing Sheets

(51) Int. Cl.
   *H01L 21/4763* (2006.01)
   *H01L 27/14* (2006.01)
   *H01L 31/0224* (2006.01)
   *H01L 21/283* (2006.01)
   *H01L 31/028* (2006.01)

(56) References Cited

U.S. PATENT DOCUMENTS

| | | | | |
|---|---|---|---|---|
| 8,887,926 | B2* | 11/2014 | Park et al. | 210/500.25 |
| 2009/0140237 | A1* | 6/2009 | Wu et al. | 257/40 |
| 2011/0051322 | A1* | 3/2011 | Pushparaj et al. | 361/525 |
| 2011/0117202 | A1* | 5/2011 | Bourke et al. | 424/490 |
| 2011/0208021 | A1* | 8/2011 | Goodall et al. | 600/309 |
| 2012/0132930 | A1* | 5/2012 | Young et al. | 257/84 |
| 2013/0118906 | A1* | 5/2013 | Cronin et al. | 205/340 |
| 2013/0188245 | A1* | 7/2013 | Jaiswal | 359/350 |
| 2013/0293884 | A1* | 11/2013 | Lee et al. | 356/301 |
| 2014/0227548 | A1* | 8/2014 | Myrick | 428/570 |

OTHER PUBLICATIONS

Lee, Dong Hyun, "Fabrication of Nano-patterning using the Self-Assembly of Block Copolymers", KIC News, vol. 15, No. 1, 2012, 14 pages.

* cited by examiner

< Drying >

Template

Metal pattern

Template

Metal pattern

Template

Metal pattern

Template

Metal pattern

NANOSTRUCTURE, OPTICAL DEVICE INCLUDING THE SAME, AND METHODS OF MANUFACTURING THE NANOSTRUCTURE AND THE OPTICAL DEVICE

CROSS-REFERENCE TO RELATED APPLICATIONS

This application claims priority from Korean Patent Application No. 10-2013-0016058, filed on Feb. 14, 2013, in the Korean Intellectual Property Office, the disclosure of which is incorporated herein in its entirety by reference.

BACKGROUND

1. Field

The present disclosure relates to nanostructures, devices including the nanostructures, and methods of manufacturing the nanostructures and the devices, and more particularly, to plasmonic nanostructures, optical devices (photodetectors) including the plasmonic nanostructures, and methods of manufacturing the plasmonic nanostructures and the optical devices.

2. Description of the Related Art

Graphene, which is a hexagonal single layer structure composed of carbon atoms, may exhibit structurally and chemically stable and electrically and physically excellent characteristics. For example, graphene may have a charge mobility ($\sim 2 \times 10^5$ cm$^2$/Vs) that is about 100 or more times faster than that of silicon (Si) and may have a current density (about $10^8$ A/cm$^2$) that is about 100 or more times higher than that of copper (Cu). Because of this, graphene has drawn attention as a next generation material capable of overcoming the limitations of existing elements.

Owing to the diverse advantages of graphene, research into the application of graphene to various electronic devices and optoelectronic devices has been conducted. In this regard, research into optical devices using photocurrent generated by graphene has been also conducted. However, it is not easy to form various nanostructure patterns on graphene, which makes it difficult to manufacture diverse devices to which graphene and nanostructure patterns are applied.

SUMMARY

One or more embodiments provide methods of forming a nanostructure (e.g., a plasmonic nanostructure) on a nanomaterial layer such as graphene, and structures formed by using the methods.

One or more embodiments also provide devices (optical devices) including a nanostructure (e.g., a plasmonic nanostructure) formed on a nanomaterial layer such as graphene, and methods of manufacturing the devices.

According to an aspect of an embodiment, there is provided a method of manufacturing a nanostructure, the method including: preparing a graphene layer; forming a block copolymer template layer directly on the graphene layer and a precursor pattern of metal coupled to the block copolymer template layer; and forming a metal nanopattern on the graphene layer by removing the block copolymer template layer and reducing the precursor pattern.

The block copolymer template layer may be formed by using a polymer solution in which a block copolymer including a hydrophobic first polymer and a hydrophilic second polymer is mixed in a hydrophobic solvent.

The block copolymer may include one of PS-b-P4VP, PS-b-P2VP, PS-b-PEO, PS-b-PAA, PI-b-P4VP, PI-b-P2VP, PI-b-PEO, PI-b-PAA, PMMA-b-P4VP, PMMA-b-P2VP, PMMA-b-PEO, PMMA-b-PAA, PS-b-PMA, PS-b-PMMA, PI-b-PMA, PI-b-PMMA, PMMA-b-PMA, PS-b-PS-OH, and PI-b-PS-OH or mixtures thereof.

The hydrophobic solvent may include one of toluene, a toluene/THF (tetrahydrofuran) mixing solution, xylene, and ethylbenzene, or mixtures thereof.

The block copolymer template layer and the precursor pattern of the metal may be concurrently formed on the graphene layer.

The forming of the block copolymer template layer and the precursor pattern of the metal may include: applying a polymer solution including a block copolymer and a precursor of metal on the graphene layer.

The forming of the precursor pattern of the metal may include: after forming the block copolymer template layer on the graphene layer, soaking the block copolymer template layer in a precursor solution of metal.

The removing of the block copolymer template layer and the reducing of the precursor pattern may include: treating the block copolymer template layer and the precursor pattern with plasma.

The plasma may be hydrogen or oxygen plasma.

The block copolymer template layer may be formed having a micelle structure.

The metal nanopattern may be formed in a dot pattern.

The method may further include: after forming the block copolymer template layer, modifying a shape of the block copolymer template layer, wherein the precursor pattern of the metal is coupled to the modified block copolymer template layer.

The modifying of the shape of the block copolymer template layer may include: soaking the block copolymer template layer in an alcohol-based solvent; and drying the block copolymer template layer taken from the alcohol-based solvent.

The block copolymer template layer may have a micelle structure, wherein the modifying of the shape of the block copolymer template layer includes: modifying the shape of the block copolymer template layer so as to have a porous structure.

The metal nanopattern may be a ring pattern.

The metal nanopattern may be a plasmonic nanostructure.

According to another aspect, there is a method of manufacturing an optical device, the method including: forming a nanostructure including a metal nanopattern on a graphene layer by using the method of manufacturing a nanostructure; and forming first and second electrodes contacting the nanostructure.

The optical device may be a plasmonic photodetector.

According to an aspect of another embodiment, there is provided a method of manufacturing a nanostructure, the method including: preparing a graphene layer; forming a block copolymer template layer on the graphene layer; modifying a shape of the block copolymer template layer; forming a precursor pattern of metal coupled to the modified block copolymer template layer; and forming a metal nanopattern on the graphene layer by removing the block copolymer template layer and reducing the precursor pattern.

The block copolymer template layer may be formed so as to have a micelle structure, wherein the modifying of the shape of the block copolymer template layer includes: modifying the shape of the block copolymer template layer to a porous structure.

The modifying of the shape of the block copolymer template layer may include: soaking the block copolymer template layer in an alcohol-based solvent; and drying the block copolymer template layer taken from the alcohol-based solvent.

The metal nanopattern may be a ring pattern.

The metal nanopattern may be a plasmonic nanostructure.

According to an aspect of another embodiment, there is provided a method of manufacturing an optical device, the method including: forming a nanostructure including a metal nanopattern on a graphene layer by using the method of manufacturing a nanostructure; and forming first and second electrodes contacting the nanostructure.

The optical device may be a plasmonic photodetector.

According to an aspect of another embodiment, there is provided a method of manufacturing a nanostructure, the method including: preparing an underlayer; forming a multi-component block copolymer template layer and a multi-component metal precursor pattern coupled to the multi-component block copolymer template layer on the underlayer; and forming a multi-component metal nanopattern reduced from the multi-component metal precursor pattern on the underlayer by removing the multi-component block copolymer template layer and reducing the multi-component metal precursor pattern.

The underlayer may include graphene.

The forming of the multi-component block copolymer template layer and the multi-component metal precursor pattern may include: preparing a first solution including a first block copolymer and a first metal precursor coupled to the first block copolymer; preparing a second solution including a second block copolymer and a second metal precursor coupled to the second block copolymer; preparing a mixed solution by mixing the first solution and the second solution; and applying the mixed solution onto the underlayer.

The forming of the multi-component block copolymer template layer and the multi-component metal precursor pattern may include: preparing a multi-component polymer solution including a first block copolymer and a second block copolymer; forming the multi-component block copolymer template layer by applying the multi-component polymer solution on the underlayer; soaking the multi-component block copolymer template layer in a first precursor solution including a first metal precursor and coupling the first metal precursor to the multi-component block copolymer template layer; and soaking the multi-component block copolymer template layer in a second precursor solution including a second metal precursor and coupling the second metal precursor to the multi-component block copolymer template layer.

The method may further include: after forming the multi-component block copolymer template layer, modifying the shape of the multi-component block copolymer template layer, wherein the multi-component metal precursor pattern is coupled to the modified multi-component block copolymer template layer.

The removing of the multi-component block copolymer template layer and reducing of the multi-component metal precursor pattern may include: treating the multi-component block copolymer template layer and the multi-component metal precursor pattern with plasma.

The multi-component metal precursor pattern may be a plasmonic nanostructure.

According to an aspect of another embodiment, there is provided a method of manufacturing an optical device, the method including: forming a nanostructure including a multi-component metal nanopattern on a graphene layer by using the method of manufacturing a nanostructure; and forming first and second electrodes contacting the nanostructure.

The optical device may be a plasmonic multi-band photodetector.

According to an aspect of another embodiment, there is provided an optical device including: a carbon nanomaterial layer; a multi-component metal nanopattern formed on the carbon nanomaterial layer; and first and second electrodes respectively contacting first and second regions of the carbon nanomaterial layer on which the multi-component metal nanopattern is formed.

The carbon nanomaterial layer may include graphene.

The multi-component metal nanopattern may have a mixed structure containing a plurality of first nanostructures formed of a first metal and a plurality of second nanostructures formed of second metal.

The multi-component metal nanopattern may be formed of three or more types of metal materials.

The multi-component metal nanopattern may have a dot pattern or a ring pattern.

The multi-component metal nanopattern may be a plasmonic nanostructure, and the optical device may be a plasmonic multi-band photodetector.

BRIEF DESCRIPTION OF THE DRAWINGS

These and/or other aspects will become apparent and more readily appreciated from the following description of embodiments, taken in conjunction with the accompanying drawings of which.

DETAILED DESCRIPTION

Figure 1A:
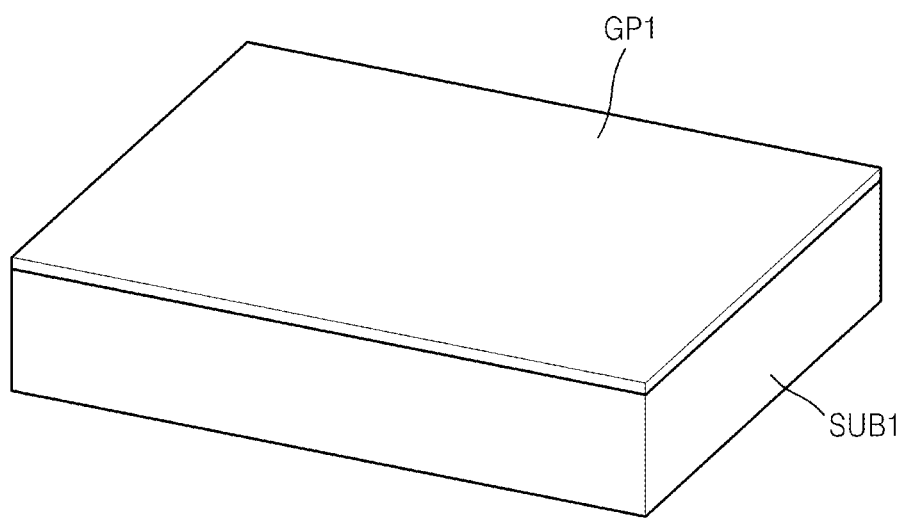
FIGS. 1A through 1G are perspective views illustrating a method of manufacturing a nanostructure, according to an embodiment.

Various exemplary embodiments will now be described more fully with reference to the accompanying drawings in which exemplary embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be understood as being limited by these terms. These terms are used only to distinguish one element, component, region, layer or section from another element, component, region, layer or section herein. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated at 90 degrees or at other orientations), and the spatially relative descriptors used herein interpreted accordingly.

The terminology used herein is provided for the purpose of describing particular embodiments only and is not intended to limit exemplified embodiments. As used herein, the singular forms "a," "an" and "the" are intended to include the plural forms as well, unless the context clearly indicates otherwise. It will be further understood that the terms "comprises" and/ or "comprising," when used in this specification, specify the presence of the stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures) of exemplary embodiments. As such, variations from the shapes of the illustrations as a result of, for example, manufacturing techniques and/or tolerances, are to be expected. Thus, the exemplary embodiments should not be construed as being limited to the particular shapes of regions illustrated herein but should be understood as including deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, and their shapes are not intended, nor should they be understood, to illustrate the actual shape of a region of a device, and the shapes are not intended to limit the scope of the exemplary embodiments.

Unless otherwise defined, all terms (including technical and scientific terms) used herein have the same meaning as commonly understood by one of ordinary skill in the art to which the exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, nanostructures (such as plasmonic nanostructures), devices (such as optical devices) including the nanostructures, and methods of manufacturing the nanostructures and the devices according to embodiments will be described with reference to the accompanying drawings. In the drawings, the widths and thicknesses of layers and regions are exaggerated for clarity of illustration. Like reference numerals in the drawings denote like elements throughout.

FIGS. 1A through 1G are perspective views for explaining a method of manufacturing a nanostructure, according to an embodiment of the present inventive concept.

Referring to FIG. 1A, a graphene layer GP1 may be formed on a substrate SUB1. The substrate SUB1 may be a polymer substrate (an organic substrate). In a case where the substrate SUB1 is a polymer substrate, the substrate SUB1 may be formed of an organic material such as PDMS (polydimethylsiloxane), PET (polyethylene terephthalate), or the like. Where the substrate SUB1 is a polymer substrate, the substrate SUB1 may be flexible and/or stretchable. Also, where the substrate SUB1 is a polymer substrate, the substrate SUB1 may have transparent characteristics based on the material from which it is made. Thus, the substrate SUB1 may be a transparent flexible substrate. The substrate SUB1 may also be an inorganic substrate. In this case, the substrate SUB1 may be composed of a conductor such as metal or a conductive metal compound, a semiconductor such as silicon, or an insulator (a dielectric substance) such as a silicon oxide or a silicon nitride. Also, the substrate SUB1 may be a glass substrate. However, the material for the substrate SUB1 is not limited thereto and may be formed from a variety of other materials. Also, the substrate SUB1 may be transparent or opaque, or may be translucent based on the circumstances.

The graphene layer GP1 formed on the substrate SUB1 has a hexagonal structure composed of carbon atoms. The graphene layer GP1 may include graphene (e.g., a graphene sheet) having from about 1 layer to about 10 layers. That is, the graphene layer GP1 may be configured to be a single graphene layer or may be configured to contain a plurality (i.e., less than about 10) of stacked graphene layers. The graphene layer GP1 may be grown on another substrate (not shown in FIG. 1A) and then transferred to the substrate SUB1 or may be a layer directly grown on the substrate SUB1. The graphene layer GP1 may be formed (e.g., grown) using chemical vapor deposition (CVD) or pyrolysis. Methods of growing and transferring the graphene layer GP1 are well known, and thus detailed descriptions thereof will not be included herein.

Figure 1B:
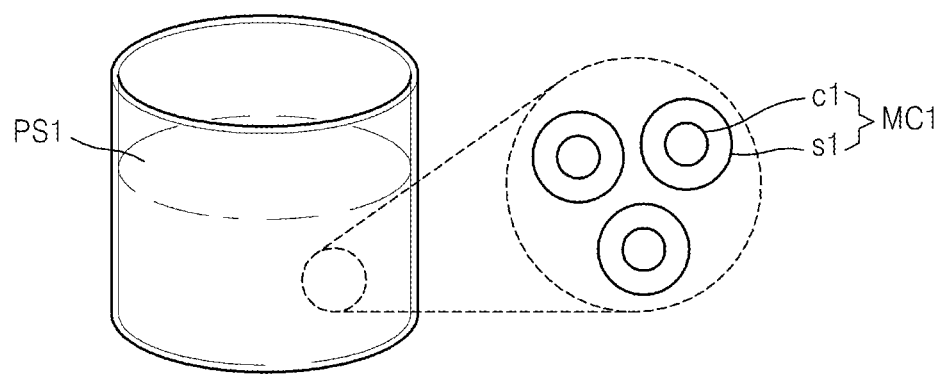

Referring to FIG. 1B, a polymer solution PS1 including a block copolymer may be prepared. The polymer solution PS1 may be made by dissolving the block copolymer in a predetermined solvent. In this regard, the block copolymer may include a hydrophobic first polymer and a hydrophilic second polymer. In this connection, the term "hydrophobic" of the first polymer and the term "hydrophilic" of the second polymer may be relative terms. That is, the first polymer being hydrophobic means that the first polymer is relatively more hydrophobic than the second polymer. Similarly to this, the second polymer being hydrophilic means that the second polymer is relatively more hydrophilic than the first polymer. As specific examples, the block copolymer may include one of PS-b-P4VP, PS-b-P2VP, PS-b-PEO, PS-b-PAA, PI-b-P4VP, PI-b-P2VP, PI-b-PEO, PI-b-PAA, PMMA-b-P4VP, PMMA-b-P2VP, PMMA-b-PEO, PMMA-b-PAA, PS-b-PMA, PS-b-PMMA, PI-b-PMA, PI-b-PMMA, PMMA-b-PMA, PS-b-PS-OH, and PI-b-PS-OH. Full names of the above-described block copolymers are listed below.

PS-b-P4VP: polystyrene-block-poly(4-vinylpyridine)
PS-b-P2VP: polystyrene-block-poly(2-vinylpyridine)
PS-b-PEO: polystyrene-block-poly(ethylene oxide)
PS-b-PAA: polystyrene-block-poly(acrylic acid)
PI-b-P4VP: polyisoprene-block-poly(4-vinylpyridine)
PI-b-P2VP: polyisoprene-block-poly(2-vinylpyridine)
PI-b-PEO: polyisoprene-block-poly(ethylene oxide)
PI-b-PAA: polyisoprene-block-poly(acrylic acid)
PMMA-b-P4VP: poly(methyl methacrylate)-block-poly(4-vinylpyridine)
PMMA-b-P2VP: poly(methyl methacrylate)-block-poly(2-vinylpyridine)
PMMA-b-PEO: poly(methyl methacrylate)-block-poly(ethylene oxide)
PMMA-b-PAA: poly(methyl methacrylate)-block-poly(acrylic acid)
PS-b-PMA: polystyrene-block-poly(methacrylic acid)
PS-b-PMMA: polystyrene-block-poly(methyl methacrylate)
PI-b-PMA: polyisoprene-block-poly(methacrylic acid)
PI-b-PMMA: polyisoprene-block-poly(methyl methacrylate)
PMMA-b-PMA: poly(methyl methacrylate)-block-poly(methacrylic acid)
PS-b-PS-OH: polystyrene-block-poly(hydroxystyrene)
PI-b-PS-OH: polyisoprene-block-poly(hydroxystyrene)

Among the above-described block copolymers, as an example, the "PS" of PS-b-P4VP may be the hydrophobic first polymer and the "P4VP" thereof may be the hydrophilic second polymer. Similarly to this, the "PS" of PS-b-P2VP may be the hydrophobic first polymer and the "P2VP" thereof may be the hydrophilic second polymer. Also, the "PS" of PS-b-PEO may be the hydrophobic first polymer and the "PEO" thereof may be the hydrophilic second polymer.

Meanwhile, the solvent used to make the polymer solution PS1 may be a hydrophobic solvent. The hydrophobic solvent may use, for example, toluene, a toluene/THF (tetrahydrofuran) mixing solution, xylene, ethylbenzene, or the like. The block copolymer may be added to the hydrophobic solvent at a concentration of, for example, about 0.3 to about 1.0 wt %. As specific examples, where PS-b-P4VP is used as the block copolymer, toluene or a toluene/THF mixed solution may be used as the hydrophobic solvent. Where the toluene/THF mixed solution is used as the hydrophobic solvent, the content of toluene in the toluene/THF mixing solution may be from about 50 to about 100 vol %. Where PS-b-P2VP is used as the block copolymer, toluene or xylene may be used as the hydrophobic solvent. However, the above-described specific materials of the block copolymer and solvent (hydrophobic solvent) are merely exemplary and may be modified in various ways.

As described above, if the block copolymer including the hydrophobic first polymer and the hydrophilic second polymer are dissolved in the hydrophobic solvent at a predetermined concentration, as shown in FIG. 1B, a micelle MC1 of the block copolymer may be formed in the polymer solution PS1. The micelle MC1 may be composed of a globular core portion c1 including the second polymer (for example, P4VP or P2VP) and a shell portion s1 including the first polymer (for example, PS). The first polymer is hydrophobic, the second polymer is hydrophilic, and the solvent in which the first and second polymers are dissolved is hydrophobic, and thus the micelles MC1 may be formed in the polymer solution PS1 via self-assembly.

Figure 1C:
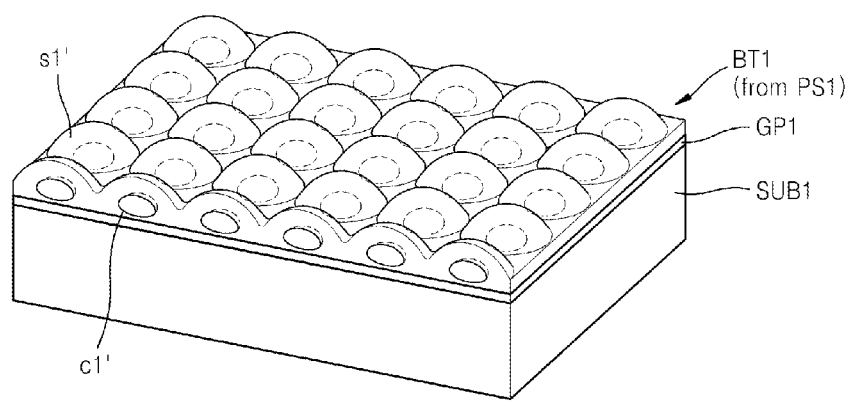

Referring to FIG. 1C, a block copolymer template layer BT1 may be formed by applying the polymer solution PS1 prepared in FIG. 1B on the graphene layer GP1 of FIG. 1A. The polymer solution PS1 of FIG. 1B may be applied on the graphene layer GP1 by, for example, spin coating. In this case, the spin coating may be performed at a speed of, for example, about 2000 to about 5000 rpm. The polymer solution PS1 of FIG. 1B is applied on the graphene layer GP1 by spin coating and then, if necessary, a drying process may be performed on the graphene layer GP1 for from about several minutes to about several tens of minutes. The drying process may be performed at room temperature, and may be performed, for example, in an atmosphere of nitrogen ($N_2$) or air. The above-formed block copolymer template layer BT1 may be a micelle film having a micelle structure. The block copolymer template layer BT1 may include a plurality of arrays of core portions c1' and shell portions s1' covering the core portions c1'. Gaps between the core portions c1' may be from about several tens to about several hundred nanometers nm. The core portions c1' may have an oval shape having a major (long) axis in a horizontal direction or a hemispherical shape, or may have shapes similar to oval or hemispherical shapes. The shell portions s1' covering the core portions c1' may form a continuous layer. A part of the shell portions s1' may be disposed between the core portions c1' and the graphene layer GP1. Thus, the core portions c1' may be somewhat spaced apart from the graphene layer GP1.

The graphene layer GP1 has hydrophobicity, and the block copolymer template layer BT1 is formed from the polymer solution PS1 as described with reference to FIG. 1B, so that the block copolymer template layer BT1 may be directly formed on the graphene layer GP1. In other words, the graphene layer GP1 is a hydrophobic material layer, and the hydrophobic shell portions s1' have an affinity for the hydrophobic graphene layer GP1, whereas the hydrophilic shell portions s1' do not have any affinity for the hydrophobic graphene layer GP1, and thus a block copolymer template layer BT1 having a micelle structure may be directly formed on the graphene layer GP1. That is, the block copolymer template layer BT1 may be formed so as to directly contact the graphene layer GP1.

In the conventional art, it may be difficult to form a block copolymer template layer directly on a graphene layer. For example, where a polymer solution layer is formed on a graphene layer and is then heated and patterned, there exists a problem in which the graphene layer and the polymer solution layer may become separated from each other as a result of the heating process. Thus, it is necessary to form an oxide layer (for example, a silicon oxide layer) on the graphene layer, and the polymer solution layer is then formed on the oxide layer. Then, subsequent processes are performed. In such a scenario, the block copolymer template layer is not directly formed on the graphene layer. However, according to the present embodiment, as described above, the polymer solution PS1, in which the block copolymer, including the hydrophobic first polymer and the hydrophilic second polymer is mixed in the hydrophobic solvent at a predetermined concentration, is applied on the graphene layer GP1, block copolymer template layer BT1 is directly formed on the graphene layer GP1.

Figure 1D:
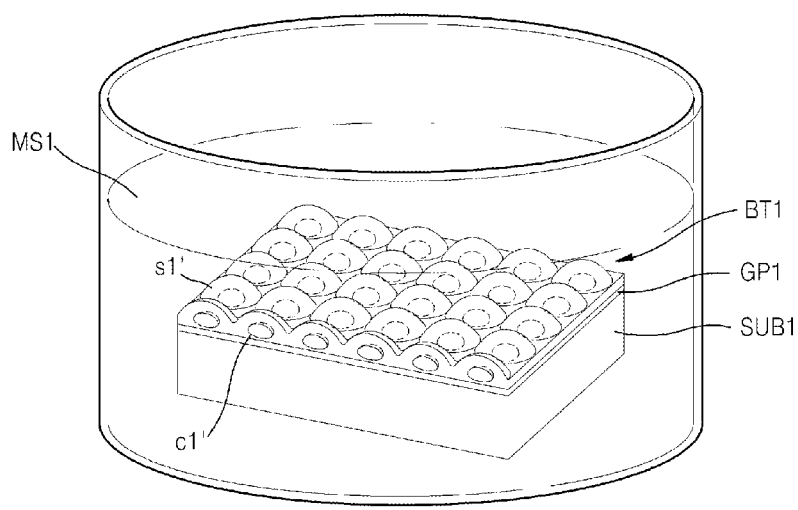

Referring to FIG. 1D, after a precursor solution of metal (hereinafter referred to as a precursor solution) MS1 is prepared, the structure illustrated in FIG. 1C may be immersed into the precursor solution MS1. The precursor solution MS1 may be produced by adding a metal precursor to a predetermined solvent. In this regard, the metal may be, for example, Au, Ag, Cu, Cr, PT, Pd, or an alloy of these. Where the metal is Au, the precursor of Au may be, for example, $HAuCl_4$ or $LiAuCl_4$. Where the metal is Ag, the precursor of Ag may be, for example, $Ag(ClO_4)$. Where the metal is Cu, the precursor of Cu may be, for example, $Cu(NO_3)_2$. Here, it is noted that the above-described specific precursor materials are merely exemplary, and various other precursor materials may be used. For example, acetate, chloride, or the like may be used as the salt in the precursor materials, instead of $ClO_4$ or $NO_3$. In addition, various medications may be possible. An alcohol-based solvent may be used as the solvent in the precursor solution MS1. The alcohol-based solvent may include, for example, ethanol, methanol, or the like. However, if circumstances so dictate, water may be used instead of the alcohol-based solvent. As a specific example, the precursor solution MS1 may be formed by adding $HAuCl_4$, the precursor of gold (Au), to ethanol. In this case, $HAuCl_4$ may be added at a concentration of from about 0.1 to about 1 wt %. The substrate SUB1 on which the graphene layer GP1 and the block copolymer template layer BT1 are formed may be soaked in the precursor solution MS1 for from several minutes to several tens of minutes, for example, from about 3 minutes to about 10 minutes.

If the substrate SUB1 on which the graphene layer GP1 and the block copolymer template layer BT1 are formed is soaked in the precursor solution MS1, the precursor material of the precursor solution MS1 may be coupled to the block copolymer template layer BT1. In this regard, the precursor material may be coupled to the core portions c1' of the block copolymer template layer BT1 since a polymer (i.e. the second polymer) corresponding to the core portions c1' includes a functional group that may be coupled to the precursor material. Thus, the precursor material may have an affinity with respect to the core portions c1' and may be selectively coupled to the core portions c1'. The shell portions s1' may have small enough thicknesses and high enough permeabilities so as to permit the precursor material to be coupled to the core portions c1' through the shell portions s1'. As a result, the precursor material may have the same shape and pattern as the core portions c1' in the block copolymer template layer BT1. Thus, a pattern of the precursor material, i.e. "a precursor pattern" may be formed. An example of the precursor pattern is shown in FIG. 1E.

Figure 1E:
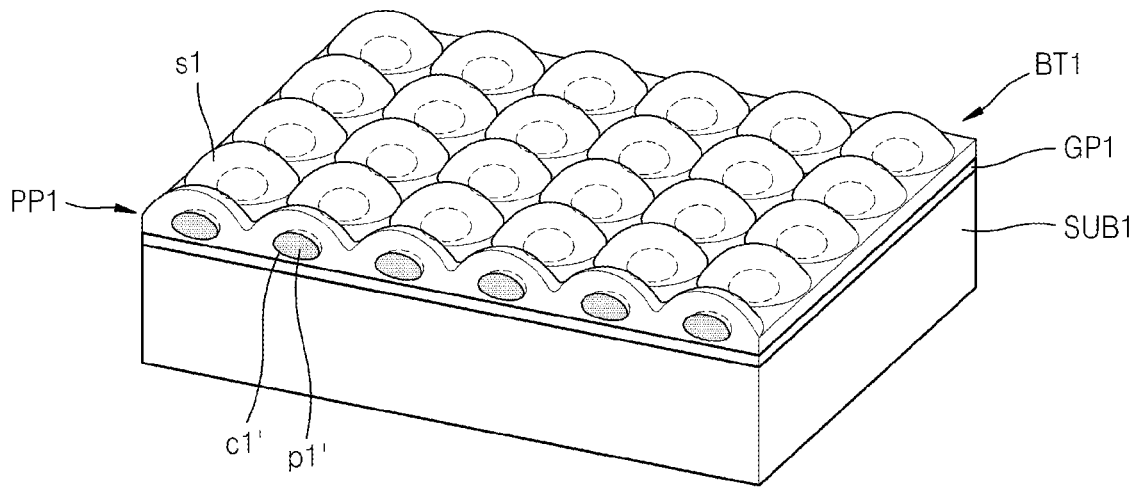

FIG. 1E shows the structure taken out of the precursor solution MS1 after the operation of FIG. 1D is performed. Referring to FIG. 1E, the precursor material is coupled to the core portions c1' in the block copolymer template layer BT1 and a precursor pattern PP1 may be formed. The precursor pattern PP1 may be the same as patterns of the core portions c1'. The precursor included in each of the core portions c1' may configure a precursor unit element p1', and an array of the precursor unit elements p1' may configure the precursor pattern PP1.

Through the processes described with reference to FIGS. 1A through 1E, the block copolymer template layer BT1 and the precursor pattern PP1 of the metal coupled to the block copolymer template layer BT1 may be formed on the graphene layer GP1. The precursor pattern PP1 of the metal may be defined by a pattern of the block copolymer template layer BT1, i.e., the patterns of the core portions c1'.

Figure 1F:
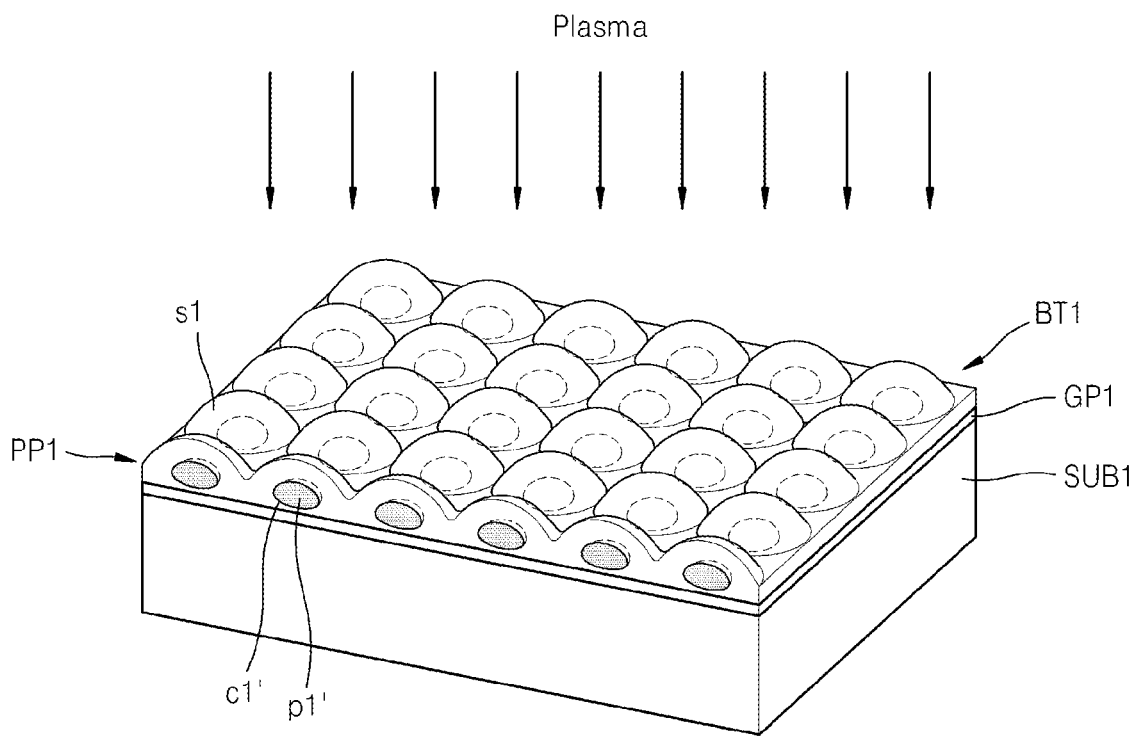

Referring to FIG. 1F, plasma treating (processing) may be performed on the block copolymer template layer BT1 and the precursor pattern PP1 of the metal. The plasma may be, for example, hydrogen ($H_2$) plasma or oxygen ($O_2$) plasma. The plasma treating (processing) may be performed for, for example, from several tens of seconds to several tens of minutes. When hydrogen plasma is used, the plasma treating (processing) may be performed for, for example, from about 1 minute to about 10 minutes. When oxygen plasma is used, the plasma treating (processing) may be performed for, for example, from about 5 minutes to about 15 minutes. Through such plasma treating (processing), the block copolymer template layer BT1 may be removed and the precursor pattern PP1 of the metal may be reduced. To reduce the precursor pattern PP1 of the metal means that the precursor pattern PP1 of the metal may be changed to "metal". The result of the plasma treating (processing) in FIG. 1F is shown in FIG. 1G.

Figure 1G:
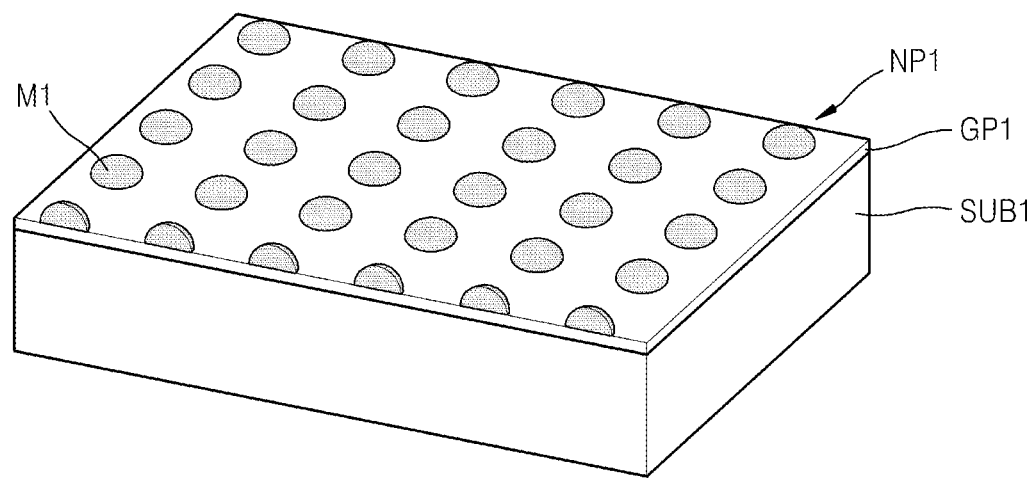

Referring to FIG. 1G, a metal nanopattern NP1, reduced from the precursor pattern PP1 of FIG. 1F, may be formed on the graphene layer GP1. In the present embodiment, the metal nanopattern NP1 may be formed in a dot pattern. Each metal element M1 constituting the metal nanopattern NP1 may have a diameter of, for example, from several tens of nm to several hundreds of nm. Also, the metal elements M1 may have hemispherical shapes or shapes similar to hemispherical shapes.

The metal nanopattern NP1 of FIG. 1G may be a plasmonic nanostructure. That is, the metal nanopattern NP1 may be a factor that causes surface plasmon resonance. A structure including the graphene layer GP1 and the metal nanopattern NP1 formed on the graphene layer GP1 may be applied to various optical devices (optoelectronic devices).

The embodiment described with reference to FIGS. 1A through 1G may be performed at room temperature or a low temperature (for example, lower than about 50° C.) similar to room temperature, and may have various advantages in this regard. For example, various polymer materials may be easily used as the substrate SUB1. Thus, a flexible and stretchable device may be manufactured. Also, since no heating process is performed, the prior art problems in which characteristics of graphene deteriorate due to heat or the interface characteristics between graphene and adjacent materials deteriorate may be prevented. In addition, various advantages may be obtained. These advantages obtained from low temperature processing may apply to other embodiments that will be described below.

According to another embodiment, a metal precursor material may be added to the polymer solution PS1 in the operation of FIG. 1B. The metal precursor material may be coupled to the core portions c1' in a liquid state, and then the solution may be applied onto the graphene layer GP1. This embodiment will be described in more detail with reference to FIGS. 2A through 2D.

Figure 2A:
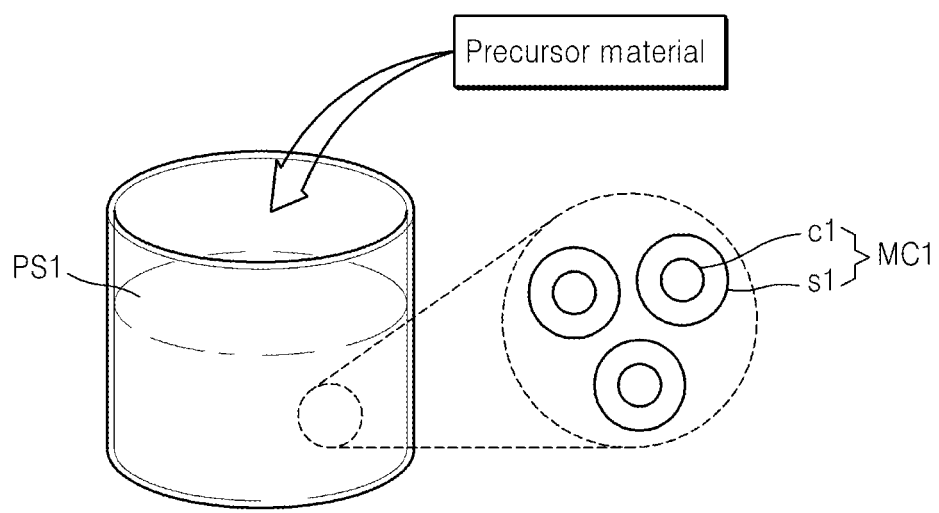
FIGS. 2A through 2D are perspective views illustrating a method of manufacturing a nanostructure, according to another embodiment.

Referring to FIG. 2A, a metal precursor material may be added to the polymer solution PS1 of FIG. 1B. The precursor material may be the same as described with reference to FIG. 1D or may be similar thereto. That is, the precursor material may be, for example, $HAuCl_4$, $LiAuCl_4$, $Ag(ClO_4)$, or $Cu(NO_3)_2$. The resulting solution obtained by adding the precursor material to the polymer solution PS1 may be the same as that to be described with reference to FIG. 2B.

Figure 2B:
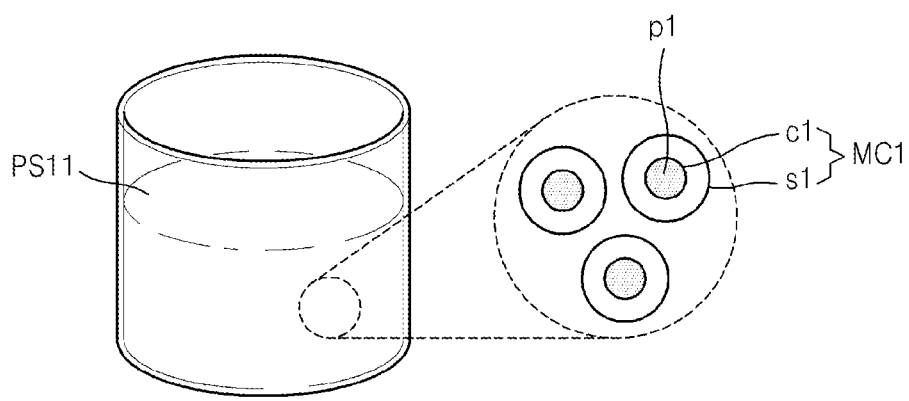

Referring to FIG. 2B, the metal precursor material may be coupled to the core portions c1 in a liquid state. The precursor material included in each of the core portions c1 may configure a precursor unit element p1. This may be similar to the precursor unit element p1' formed by coupling the precursor material to the core portions c1' of FIG. 1E. A polymer solution including the metal precursor material in FIG. 2B is denoted PS11.

Figure 2C:
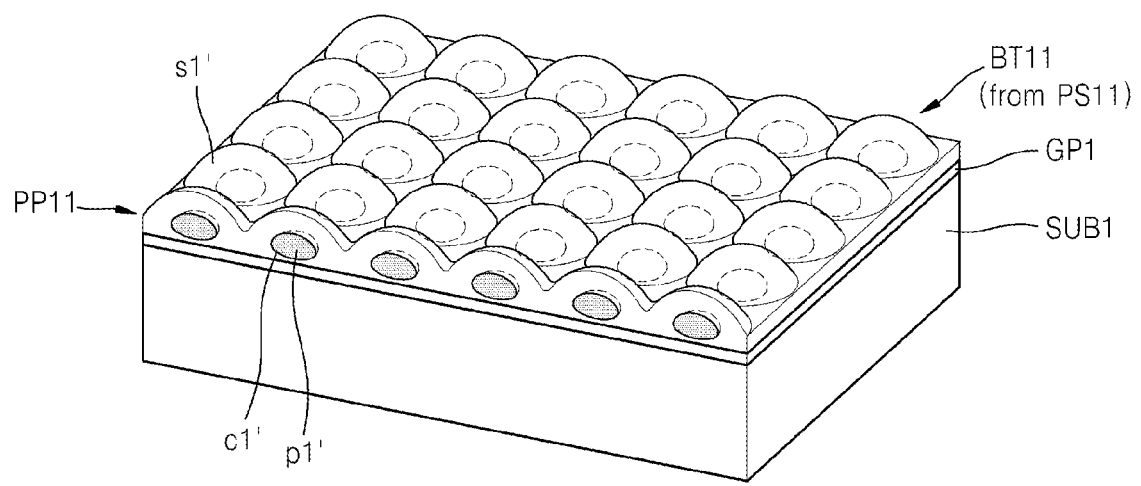

Referring to FIG. 2C, a block copolymer template layer BT11 may be formed by applying the polymer solution PS11 on the graphene layer GP1. In this regard, the block copolymer template layer BT11 may include the precursor unit element p1' coupled to the core portions c1' and an array of the precursor unit element p1' may configure a precursor pattern PP11. The block copolymer template layer BT11 and the precursor pattern PP11 coupled to the block copolymer template layer BT11 may be substantially the same as or similar to the block copolymer template layer BT1 and the precursor pattern PP1 of FIG. 1E, respectively.

Figure 2D:
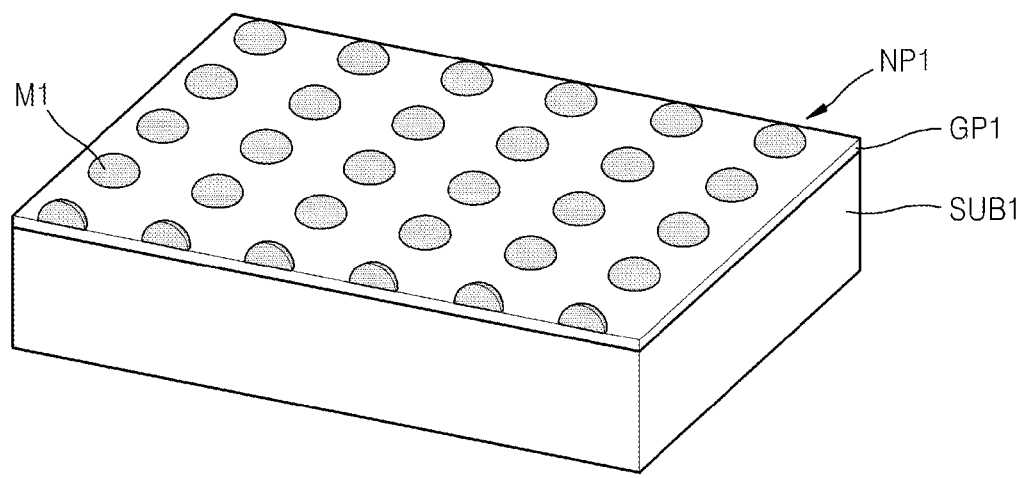

The plasma treating (processing) of FIG. 1F may be performed on a structure of FIG. 2C (not shown), and thus, the resulting structure shown in FIG. 2D may be obtained. The structure of FIG. 2D may be substantially the same as or similar to the structure of FIG. 1G.

As described in the present embodiment, if the polymer solution PS11 to which the precursor material is added is applied onto the graphene layer GP1, the block copolymer template layer BT11 and the precursor pattern PP11 may be concurrently formed on the graphene layer GP1 (FIG. 2C). Thus, the process may be simplified and productivity may be improved.

According to another embodiment, an operation of modifying the shape of the block copolymer template layer BT1 may be further performed in the combination shown in, e.g., FIG. 1C. After the shape of the block copolymer template layer BT1 is modified, a precursor pattern of metal coupled to the modified block copolymer template layer is formed, then the modified block copolymer template layer is removed, the precursor pattern is reduced, and a metal nanopattern may be thus formed. This embodiment will be described in more detail with reference to FIGS. 3A through 3G.

Figure 3A:
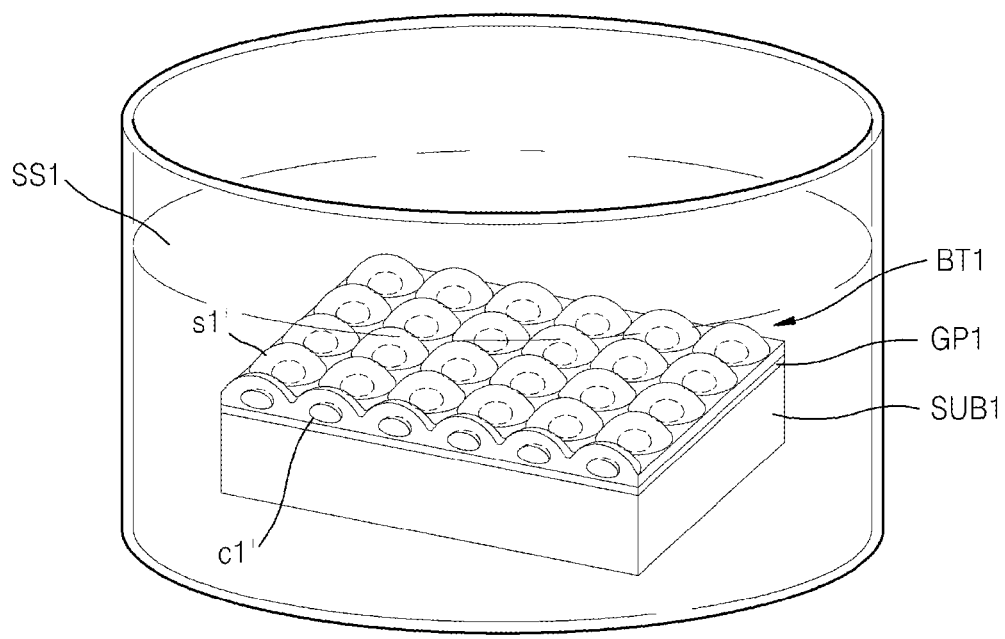
FIGS. 3A through 3G are perspective views illustrating a method of manufacturing a nanostructure, according to another embodiment.

Referring to FIG. 3A, to modify the shape of the block copolymer template layer BT1 of FIG. 1C, for example, the substrate SUB1 on which the block copolymer template layer BT1 is formed may be soaked in a predetermined solvent SS1 for several to several tens of minutes. In this regard, the solvent SS1 may be an alcohol-based solvent such as ethanol or methanol. If the block copolymer template layer BT1 is soaked in the solvent SS1, the shape of the block copolymer template layer BT1 may be modified by the solvent SS1. The result of such a process is shown in FIG. 3B.

Figure 3B:
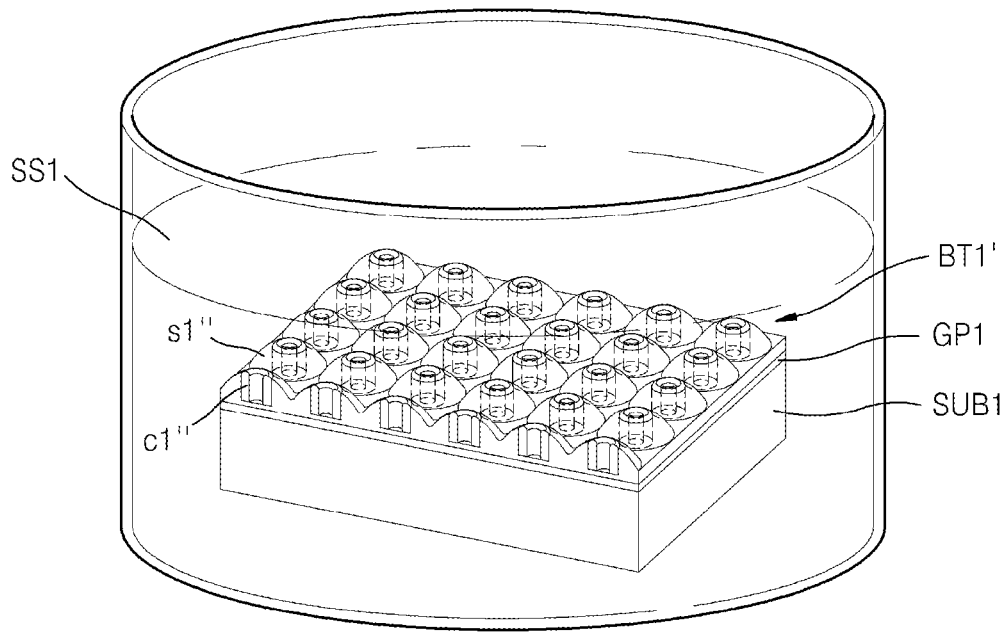

FIG. 3B shows the shape of the modified block copolymer template layer BT1'. The modified block copolymer template layer BT1' may include modified core portions c1" and modified shell portions s1". The modified core portions c1" may have a structure having pores (holes) formed in a center part thereof and somewhat extending onto the shell portions s1". The modified shell portions s1" may have a structure in which there are openings corresponding to the pores (holes) of the modified core portions c1" and the modified shell portions s1" surround the modified core portions c1", respectively. The principle behind forming the modified block copolymer template layer BT1' will now be described below.

If the block copolymer template layer BT1 is soaked in the solvent SS1 in FIG. 3A, a part of the polymer of the core portions c1' may penetrate into the shell portions s1' above and come out of the shell portions s1'. Thus, the core portions c1' may be modified to the structure in which the pores (holes) are formed in the center part of the core portions c1', and the part of the polymer of the core portions c1' may somewhat extend onto the shell portions s1', and thus, as shown in FIG. 3B, the modified core portions c1" and the modified shell portions s1" may be formed. Such modifications may be made since the solvent SS1 does not have an affinity for the polymer (i.e., the hydrophobic first polymer) of the shell portions s1' but has affinity for the polymer (i.e. the hydrophilic second polymer) of the core portions c1'. Thus, the polymer (i.e. the hydrophilic second polymer) of the core portions c1' of the block copolymer template layer BT1 may penetrate into the shell portions s1' and contact the solvent SS1. For this reason, the shape of the block copolymer template layer BT1 may be modified in the solvent SS1 as shown in FIG. 3B. The modified block copolymer template layer BT1' may have a porous structure in which a plurality of pores are formed. Thus, the block copolymer template layer BT1 having a micelle structure of FIG. 3A may be modified into a block copolymer template layer BT1 having the porous structure of FIG. 3B.

Figure 3C:
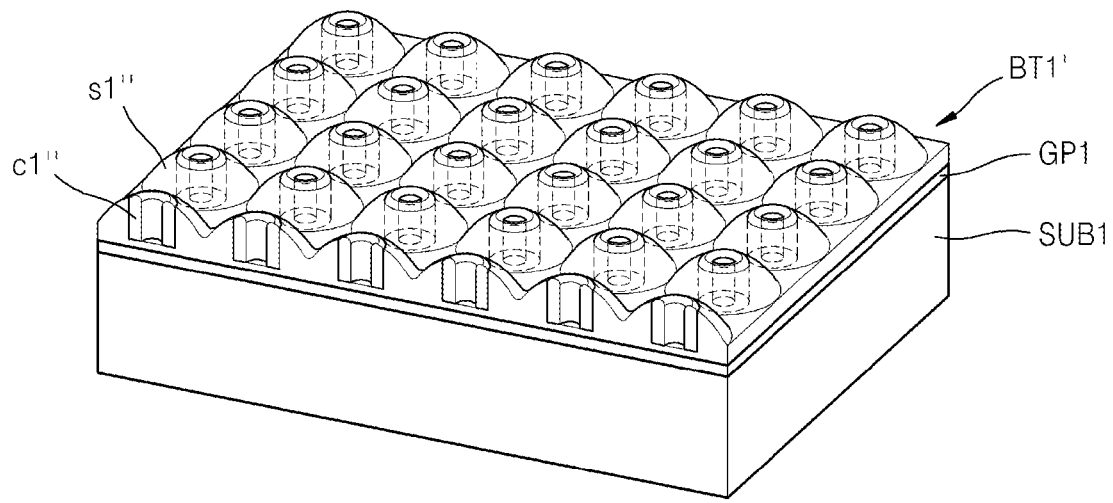

Referring to FIG. 3C, after the substrate SUB1 including the modified block copolymer template layer BT1' is removed from the solvent SS1, a predetermined drying process may be performed if necessary. The drying process may be performed, for example, at a room temperature or at a temperature similar to the room temperature. The drying process may be performed while blowing, i.e. purging, nitrogen ($N_2$), argon (Ar), air, or the like over the modified block copolymer template layer BT1'. Through the drying process, solvent (not shown) remaining in the modified block copolymer template layer BT1' may be removed.

Figure 3D:
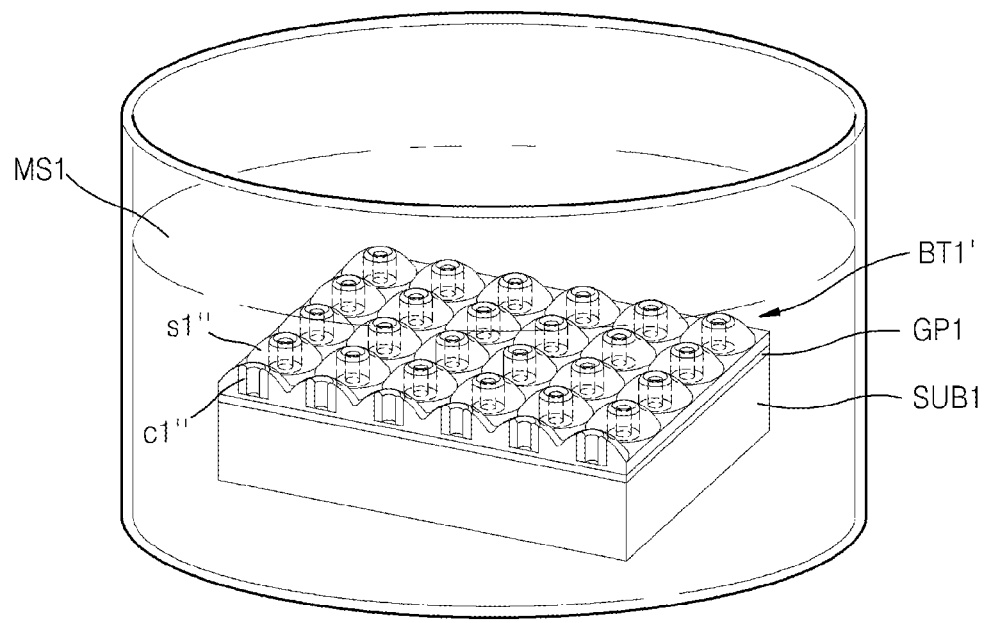

Referring to FIG. 3D, if the substrate SUB1 on which the graphene layer GP1 and the modified block copolymer template layer BT1' are formed is placed into the metal precursor solution MS1, the precursor material in the metal precursor solution MS1 may be coupled to the modified block copolymer template layer BT1'. In this regard, the precursor material may be coupled to the modified core portions c1". As a result, a pattern of the precursor material, i.e. a "precursor pattern", may be formed. The result is shown in FIG. 3E.

Figure 3E:
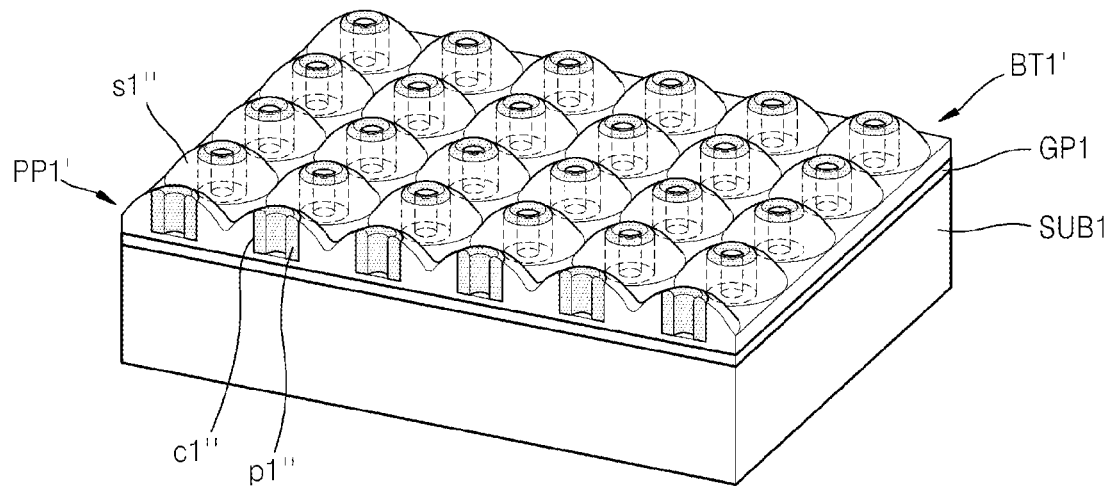

FIG. 3E shows the structure removed from the precursor solution MS1 of FIG. 3D. Referring to FIG. 3E, the precursor material may be coupled to the modified core portions c1" of the modified block copolymer template layer BT1' so that a precursor pattern PP1' may be formed. A precursor included in each of the core portions c1" may configure a precursor unit element p1" and an array of the precursor unit element p1" may constitute the precursor pattern PP1'.

Figure 3F:
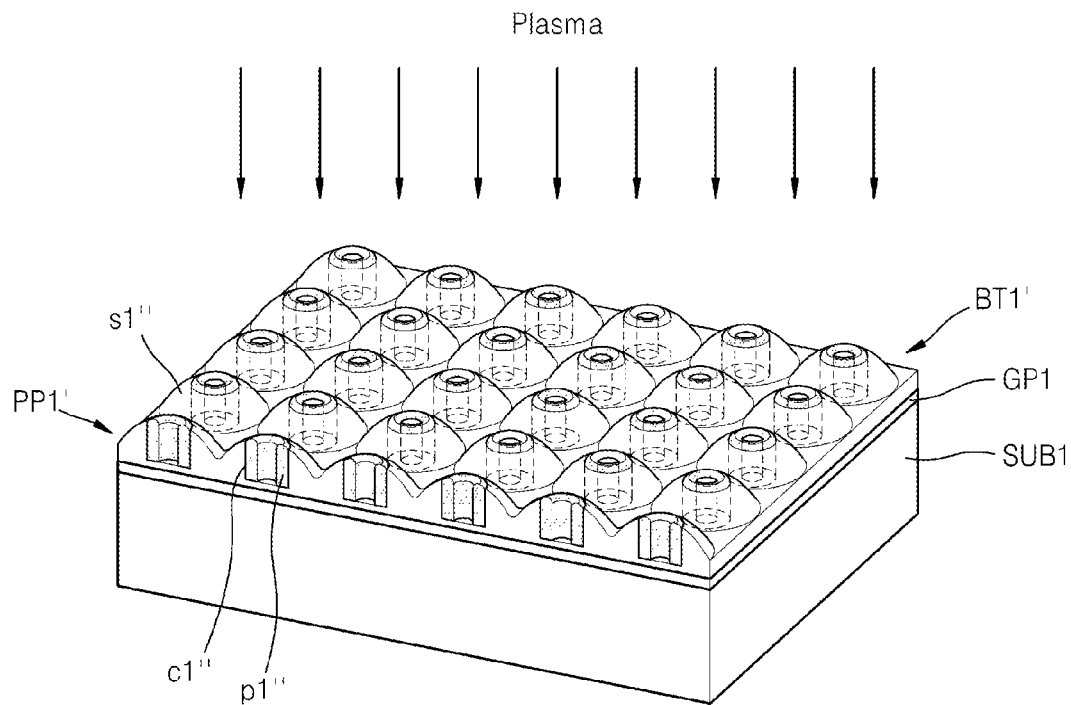

Referring to FIG. 3F, plasma treating (processing) may be performed on the modified block copolymer template layer BT1' and the precursor pattern PP1'. The plasma treating (processing) may be the same as or similar to the plasma treating (processing) described with reference to FIG. 1F. The result of the plasma treating (processing) of FIG. 3F is shown in FIG. 3G.

Figure 3G:
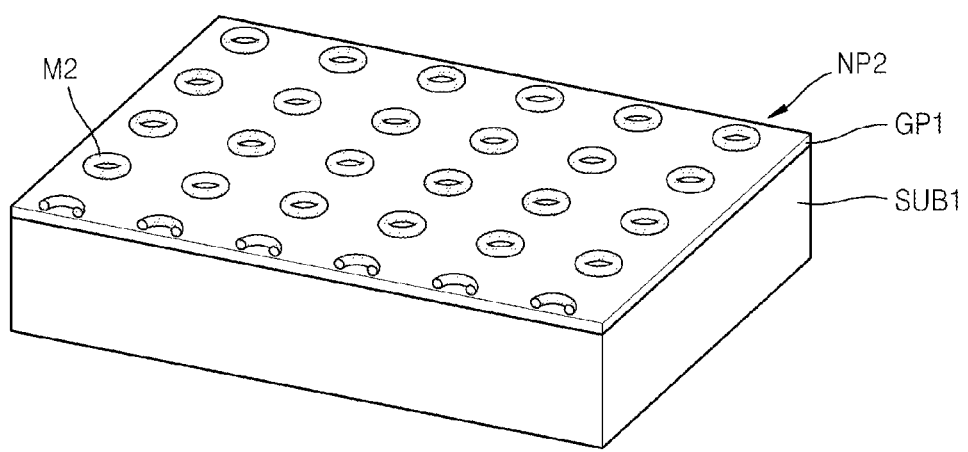

Referring to FIG. 3G, a metal nanopattern NP2 reduced from the precursor pattern PP1' of FIG. 3F may be formed on the graphene layer GP1. In the present embodiment, the metal nanopattern NP2 may be formed in a ring pattern. Each of the metal elements (ring elements) M2 constituting the metal nanopattern NP2 may have a diameter (an external diameter) of from about several tens of nm to about several hundreds of nm.

The metal nanopattern NP2 of FIG. 3G may be a plasmonic nanostructure similar to the metal nanopattern NP1 of FIG. 1G. The metal nanopattern NP2 may be a factor that causes surface plasmon resonance. A structure including the graphene layer GP1 and the metal nanopattern NP2 formed on the graphene layer GP1 may be applied to various optical devices (optoelectronic devices).

Figure 4A:
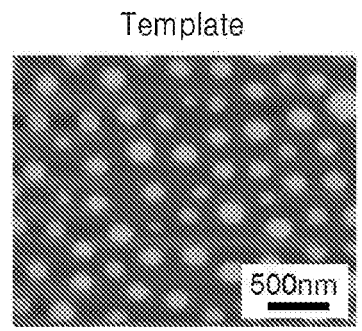
FIGS. 4A and 4B are atomic force microscope (AFM) plan images showing a block copolymer template layer and metal patterns (dot patterns) manufactured from the block copolymer template layer, according to an embodiment.
Figure 4B:
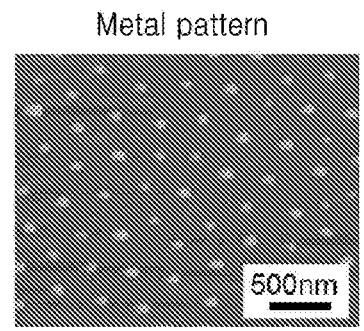

FIGS. 4A and 4B are atomic force microscope (AFM) images showing a block copolymer template layer and metal patterns (dot patterns) manufactured from the block copolymer template layer, according to an embodiment.

The block copolymer template layer of FIG. 4A corresponds to the block copolymer template layer BT1 of FIG. 1C. The metal patterns (the dot patterns) of FIG. 4B correspond to the metal nanopatterns NP1 of FIG. 1G. The block copolymer template layer of FIG. 4A was formed by spin coating a polymer solution in which PS-b-P2VP (having a total molecular weight of 793 kg/mol) was dissolved in a xylene solvent at a concentration of 0.5 wt % on a graphene layer at 3000 rpm. The metal patterns (the dot patterns) of FIG. 4B were produced by soaking the copolymer template layer of FIG. 4A in a precursor solution of Au, i.e. ethanol containing $HAuCl_4$, and plasma treating (processing) the copolymer template layer.

Referring to FIG. 4A, a plurality of core portions (corresponding to the core portions of FIG. 1C) of the copolymer template layer (i.e. a micelle film) are arranged in relatively uniform shapes. In this regard, the interval between adjacent core portions is about 360 nm.

Referring to FIG. 4B, the metal patterns (i.e. Au patterns) having dot shapes form an array. In this regard, the diameter of the metal dots are about 95 nm. The size and interval of the metal patterns may be determined according to the shape of the block copolymer template layer of FIG. 4A.

Figure 5A:
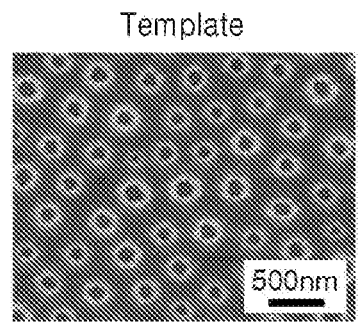
FIGS. 5A and 5B are AFM plan images showing a block copolymer template layer and metal patterns (ring patterns) manufactured from the block copolymer template layer, according to an embodiment.
Figure 5B:
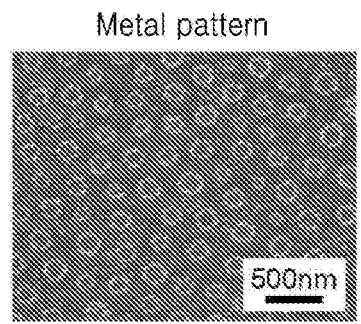

FIGS. 5A and 5B are AFM images showing a block copolymer template layer and metal patterns (ring patterns) manufactured from the block copolymer template layer, according to an embodiment.

The block copolymer template layer of FIG. 5A corresponds to the modified block copolymer template layer BT1' of FIG. 3C. The metal patterns (ring patterns) of FIG. 5B correspond to the metal nanopatterns NP2 of FIG. 3G. The block copolymer template layer of FIG. 5A was formed by spin coating a polymer solution in which PS-b-P2VP (a total molecular weight of 793 kg/mol) was dissolved in a xylene solvent at a concentration of 0.5 wt % on a graphene layer at 3000 rpm, soaking the graphene layer in ethanol for 10 minutes, purging the graphene layer using a nitrogen ($N_2$) gas, and drying the graphene layer. The metal patterns (ring patterns) of FIG. 5B were produced by soaking the copolymer template layer of FIG. 5A in a precursor solution of Au, i.e. ethanol containing $HAuCl_4$, and plasma treating (processing) the copolymer template layer.

Referring to FIG. 5A, a plurality of core portions (corresponding to the modified core portions of FIG. 3C) of the copolymer template layer (a porous structure) are relatively regularly arranged in relatively uniform shapes.

Referring to FIG. 5B, the metal patterns (i.e. Au patterns) having ring shapes form an array. In this regard, the diameter (external diameter) of the metal rings are about 100 nm.

Figure 6:
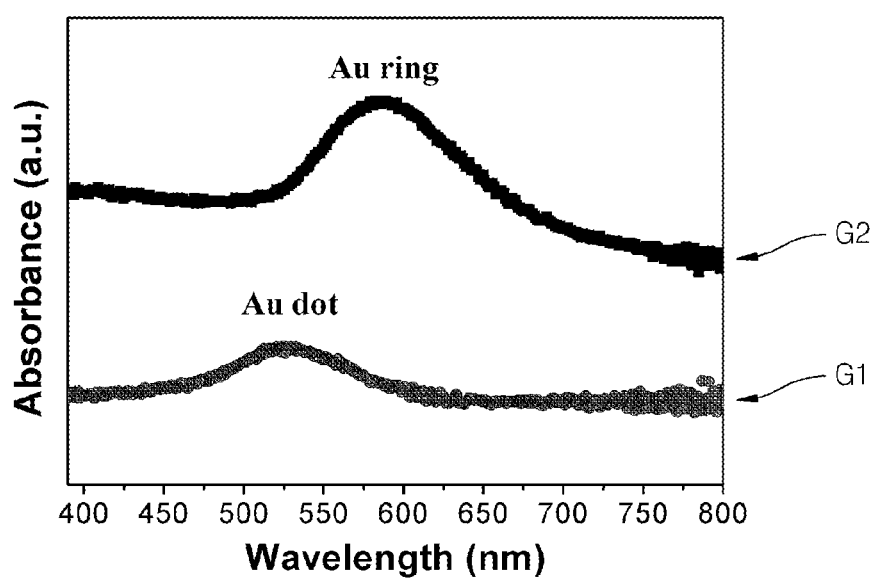
FIG. 6 is a graph showing surface plasmon bands by metal nanopatterns manufactured according to other embodiments.

FIG. 6 is a graph showing surface plasmon bands by metal nanopatterns manufactured according to certain embodiments. Referring to FIG. 6, the first graph G1 shows the result of an Au pattern having the dot pattern of FIG. 4B, and the second graph G2 shows the result of an Au pattern having the ring pattern of FIG. 5B. The results of FIG. 6 were obtained by using an ultraviolet-visible (UV-VIS) spectrum.

Referring to FIG. 6, the Au dot pattern has a peak at a wavelength of about 525 nm and a surface plasmon band corresponding to a wavelength range of about 450 nm to about 620 nm. The Au ring pattern has a peak at a wavelength of about 600 nm and a wavelength range corresponding to a surface plasmon band that is shifted to a longer (i.e., larger) wavelength as compared to the Au dot pattern. The results of FIG. 6 show that surface plasmon phenomena occur differently according to the shapes and forms of the metal (in this case, Au) nanopatterns. That is, the wavelength range of the surface plasmon phenomenon differs according to the shapes and forms of the metal (here, Au) nanopatterns.

According to an embodiment, the total molecular weight the block copolymer may be changed, thereby adjusting the size and density of the manufactured metal nanopatterns. This will be described with reference to the data in FIGS. 7A through 8B.

Figure 7A:
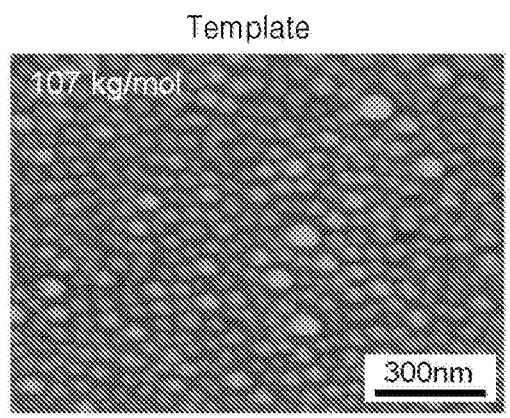
FIGS. 7A and 7B are AFM plan images showing a block copolymer template layer and metal patterns (dot patterns) manufactured from the block copolymer template layer, according to another embodiment.
Figure 7B:
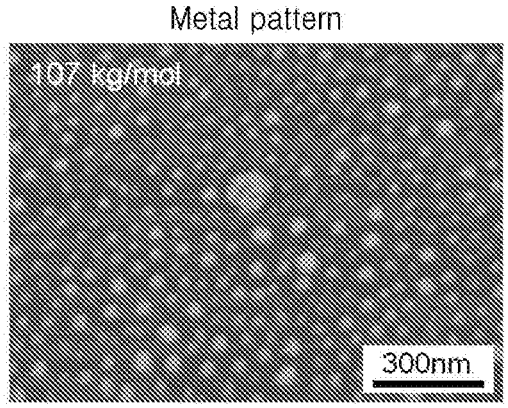

FIGS. 7A and 7B are AFM images showing a block copolymer template layer and metal patterns (dot patterns) manufactured from the block copolymer template layer, according to another embodiment. The structures in FIGS. 7A and 7B were manufactured using PS-b-P4VP having a total molecular weight of 107 kg/mol as a block copolymer.

Figure 8A:
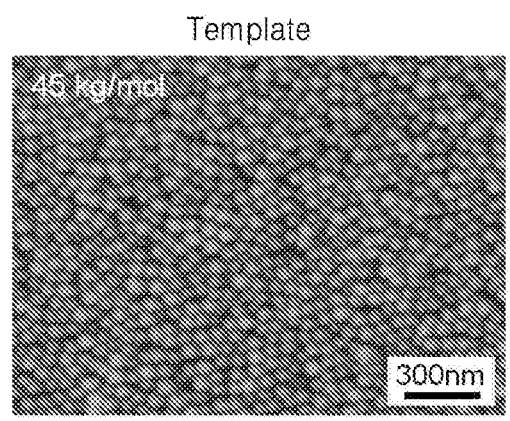
FIGS. 8A and 8B are AFM plan images showing a block copolymer template layer and metal patterns (dot patterns) manufactured from the block copolymer template layer, according to another embodiment.
Figure 8B:
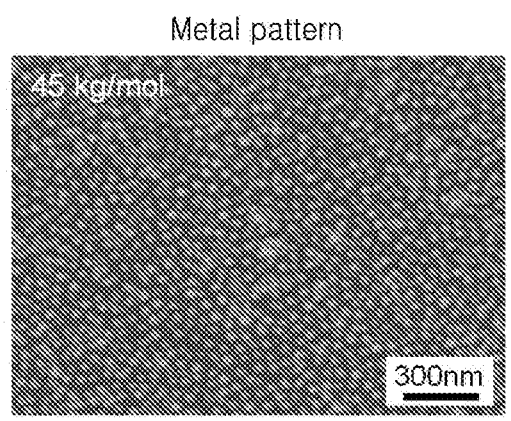

FIGS. 8A and 8B are AFM images showing a block copolymer template layer and metal patterns (dot patterns) manufactured from the block copolymer template layer, according to another embodiment. The structures in FIGS. 8A and 8B were manufactured by using PS-b-P4VP having a total molecular weight of 45 kg/mol as a block copolymer. Here, it is noted that the total molecular weight of a block copolymer such as PS-b-P4VP may differ based on the amount of connected (chained) polymer.

Comparing FIGS. 7A through 8B, it may be seen that as the total molecular weight of the block copolymer is reduced, the size of dot patterns may be reduced, and the density of the dot patterns may be increased. Such results show that the total molecular weight of the block copolymer may be changed, thereby altering the sizes and density of the resulting metal nanopatterns. Thus, metal nanopatterns having appropriately adjusted sizes and densities for a predetermined purpose may be easily manufactured and used in various devices (optical devices).

Figure 9:
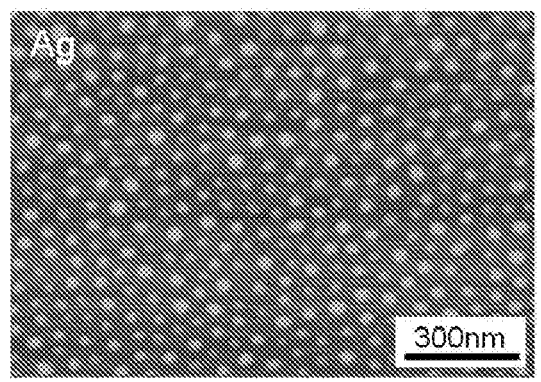
FIGS. 9 and 10 are AFM plan images showing metal nanopatterns manufactured according to another embodiment.
Figure 10:
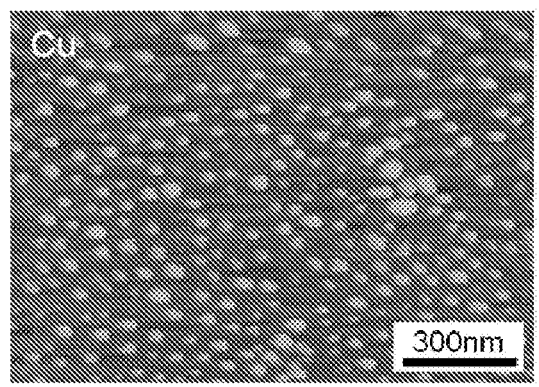

FIGS. 9 and 10 are AFM images showing metal nanopatterns manufactured according to another embodiment. FIG. 9 shows an Ag nanopattern (dot pattern) manufactured using the method described with reference to FIGS. 1A through 1G. FIG. 10 shows a Cu nanopattern (dot pattern) manufactured using the method described with reference to FIGS. 1A through 1G. The Ag pattern of FIG. 9 was manufactured using $Ag(ClO_4)$ as the precursor of Ag. The Cu pattern of FIG. 10 was manufactured using $Cu(NO_3)_2$ as the precursor of Cu. Also, the nanopatterns of FIGS. 9 and 10 were manufactured using PS-b-P4VP (having a total molecular weight of 107 kg/mol) as a block copolymer.

Referring to FIGS. 9 and 10, it can be seen that Ag and Cu nanoparticles having a diameter of about 20 nm~about 30 nm were manufactured. The interval between the nanoparticles may be the same as the interval between core portions of a block copolymer template layer (not shown). If the method of forming the Ag and Cu dot patterns of FIGS. 9 and 10 were modified to be the method described with reference to FIGS. 3A through 3G, then Ag and Cu ring patterns would have been formed.

Figure 11:
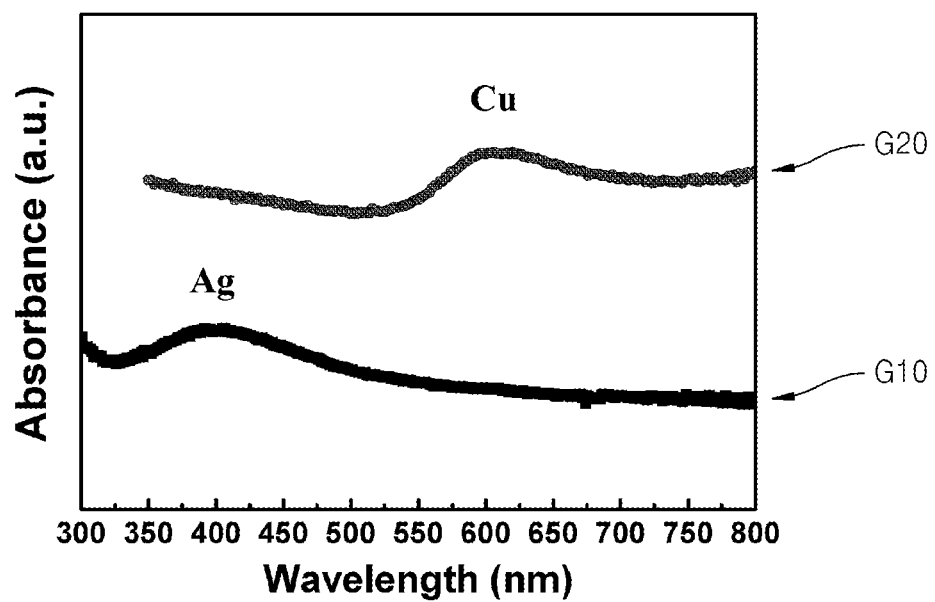
FIG. 11 is a graph showing surface plasmon bands by metal nanopatterns manufactured according to other embodiments.

FIG. 11 is a graph showing surface plasmon bands by metal nanopatterns manufactured according to certain embodiments. In FIG. 11, the first graph G10 is the result of the Ag dot pattern of FIG. 9, and the second graph G20 is the result of the Cu dot pattern of FIG. 10. The results of FIG. 11 were obtained by using a UV-VIS spectrum.

Referring to FIG. 11, the Ag dot pattern has a peak at a wavelength of about 400 nm, and the Cu dot pattern has a peak at a wavelength of about 600 nm. These results show that although patterns may have similar forms, if the type (i.e., the material) of metal differs, a surface plasmon phenomenon may differently occur. That is, the wavelength range of surface plasmon bands may differ according to the type of metal.

According to another embodiment, a multi-component block copolymer and a multi-component metal precursor may be used to form a multi-component metal nanopattern array. For example, a multi-component metal nanopattern array may be formed from a block copolymer template layer including a first block copolymer coupled to a precursor material of a first metal and a second block copolymer coupled to a precursor material of a second metal. This will be described in more detail with reference to FIGS. 12A through 12D and FIGS. 13A through 13G.

FIGS. 12A through 12D are perspective views for explaining a method of manufacturing a nanostructure, according to another embodiment of the present inventive concept.

Figure 12A:
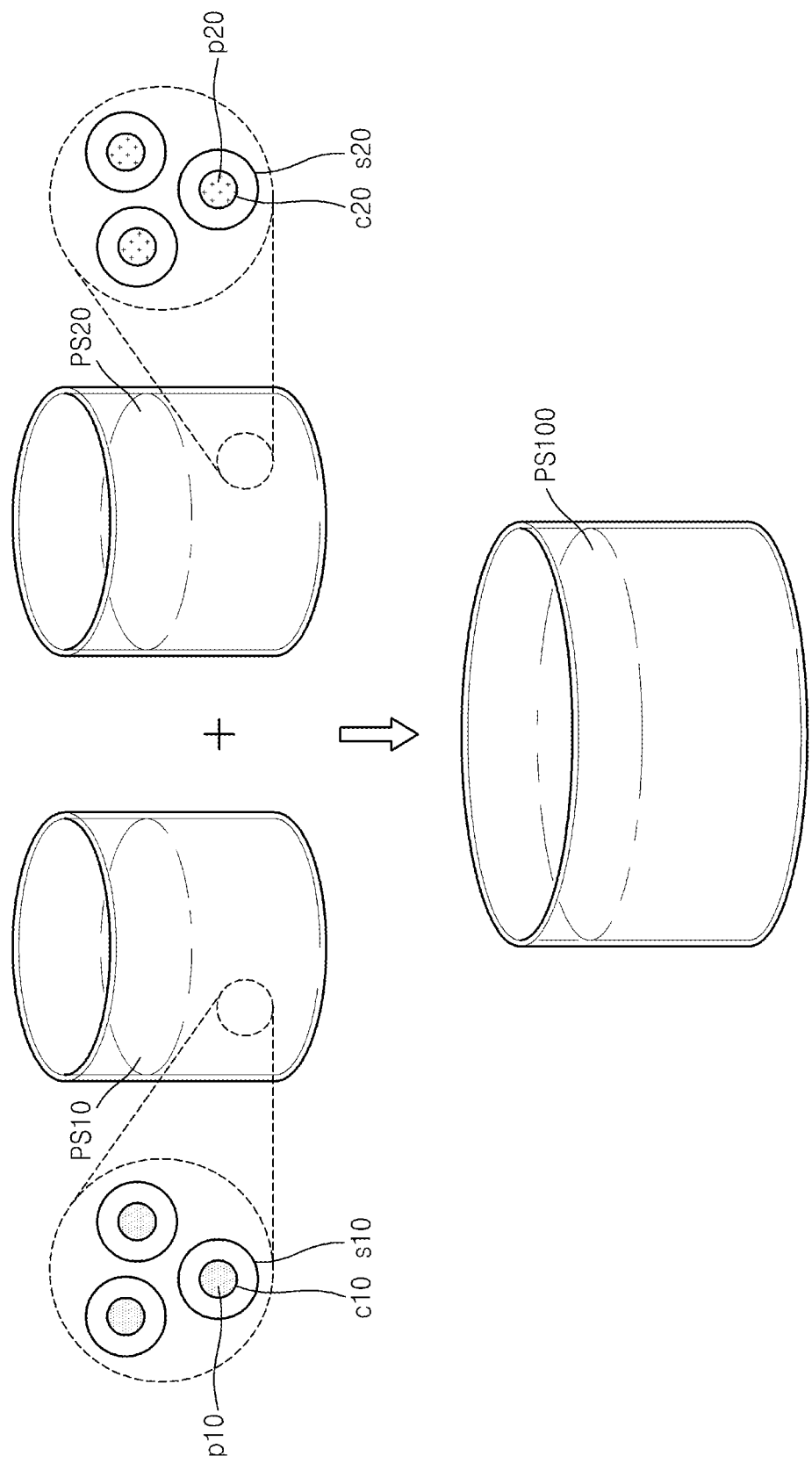
FIGS. 12A through 12D are perspective views for illustrating a method of manufacturing a nanostructure, according to another embodiment.

Referring to FIG. 12A, a first polymer solution PS10 including a first block copolymer and a precursor material of a first metal may be prepared. A second polymer solution PS20 including a second block copolymer and a precursor material of a second metal may be prepared. The first and second block copolymers may be different types. The first and second precursor materials of the first and second metal may be different types. For example, the first block copolymer may be PS-b-P2VP or PS-b-P4VP, and the second block copolymer may be PS-b-PEO. The precursor material of the first metal may be a precursor of Au (e.g., $HAuCl_4$ or $LiAuCl_4$), and the precursor material of the second metal may be a precursor of Ag (e.g., $Ag(ClO_4)$). The first and second polymer solutions PS10 and PS20 may be manufactured using a hydrophobic solvent, such as toluene, a toluene/THF mixing solution, xylene, ethylbenzene, or the like. The first polymer solution PS10 may have a similar construction to the polymer solution PS11 of FIG. 2B. That is, the first polymer solution PS10 may include a plurality of first core portions c10 and first shell portions s10 each surrounding the first core portions c10. The precursor material of the first metal may be coupled to the first core portions c10. The precursor material of the first metal coupled to the first core portions c10 may configure a first precursor unit element p10. The second polymer solution PS20 may have a similar construction to the first polymer solution PS10. That is, the second polymer solution PS20 may include a plurality of second core portions c20 and second shell portions s20 each surrounding the second core portions c20. The precursor material of the second metal may be coupled to the second core portions c20. The precursor material of the second metal coupled to the second core portions c20 may configure a second precursor unit element p20.

Next, a mixed solution PS100 may be produced by mixing the first polymer solution PS10 and the second polymer solution PS20. The mixed solution PS100 may include the first core portions c10, the first precursor unit element p10 coupled to the first core portions c10, and the first shell portions s10 surrounding the first core portions c10, and the second core portions c20, the second precursor unit element p20 coupled to the second core portions c20, and the second shell portions s20 surrounding the second core portions c20. The component ratio of the mixed solution PS100 may differ according to the mixing ratio of the first and second polymer solutions PS10 and PS20. If the first and second polymer solutions PS10 and PS20 are mixed at a ratio of 1:1, the ratio of the first and second precursor unit elements p10 and p20 of the mixed solution PS100 may be 1:1.

Figure 12B:
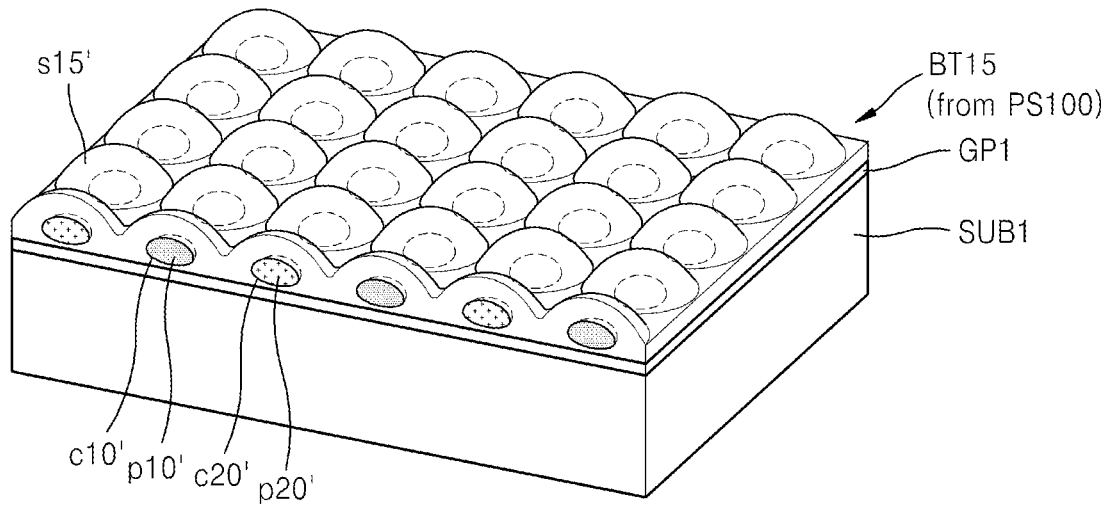

Referring to FIG. 12B, a block copolymer template layer BT15 may be formed by applying (e.g., coating) the mixing solution PS100 prepared in FIG. 12A onto the graphene layer GP1 of FIG. 1A. The mixed solution PS 100 of FIG. 12A may be applied onto the graphene layer GP1 by spin coating. In such a case, the spin coating may be performed at, for example, a speed of from about 2000 to about 5000 rpm. After the mixed solution PS100 of FIG. 12A is applied onto the graphene layer GP1 by spin coating, a drying process may be performed for several or several tens of minutes if necessary. The drying process may be performed at a room temperature, for example, and in a nitrogen ($N_2$) or air atmosphere, for example. The above-formed block copolymer template layer BT15 may be a multi-component block copolymer template layer. The block copolymer template layer BT15 may be a micelle film having a micelle structure. The block copolymer template layer BT15 may include a plurality of first core portions c10', a plurality of second core portions c20', and shell portions s15'. The shell portions s15' may be formed by combining the first shell portions s10 and the second shell portions s20 of FIG. 12A to form a single continuous layer. The first precursor unit element p10' may be included in each of the first core portions s10'. The second precursor unit element p20' may be included in each of the second core portions c20'. The plurality of first core portions c10' and the plurality of second core portions c20' may be randomly mixed.

Figure 12C:
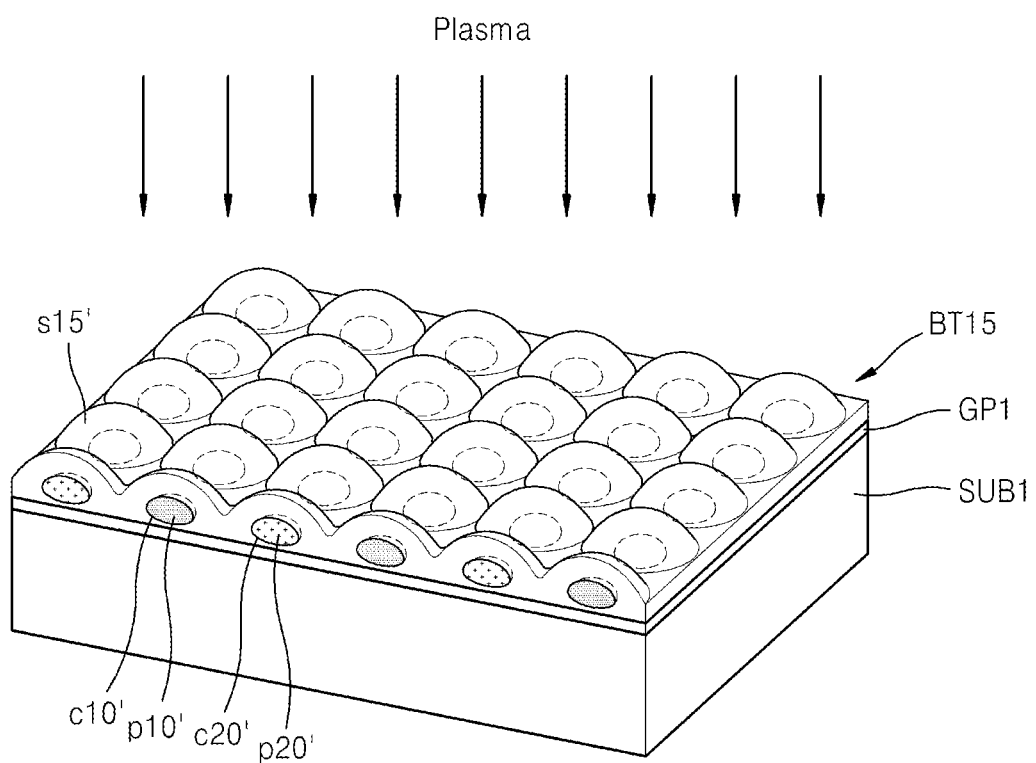

Referring to FIG. 12C, plasma treating (processing) may be performed on the structure illustrated in FIG. 12B. The plasma treating (processing) may be the same as or similar to the plasma treating (processing) described with reference to FIG. 1F. Such plasma treating (processing) may remove the block copolymer template layer BT15, reduce the first and second precursor unit elements p10' and p20', and form metal nanopatterns NP15 of FIG. 12D. The result of the plasma treating (processing) of FIG. 12C is shown in FIG. 12D.

Figure 12D:
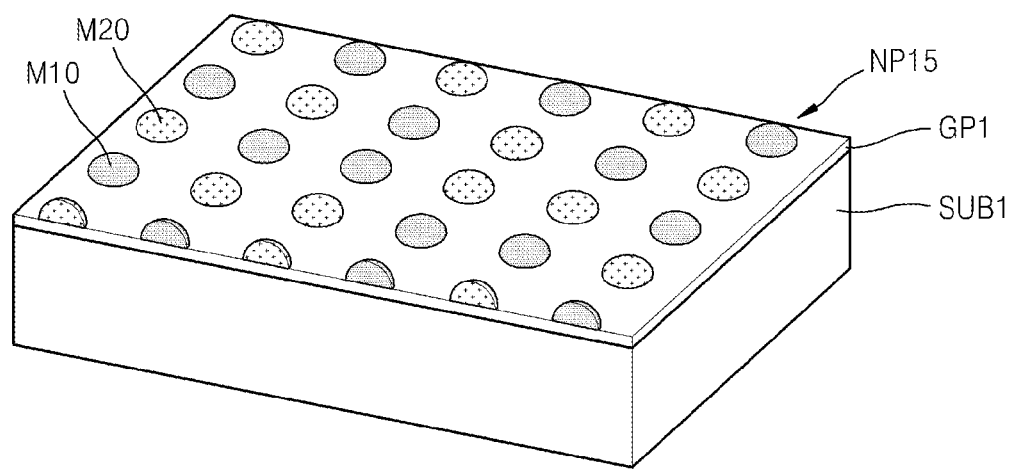

Referring to FIG. 12D, a first metal element (here, nanoparticles) M10 reduced from the first precursor unit element p10' of FIG. 12C may be formed on the graphene layer GP1. A second metal element (here, nanoparticles) M20 reduced from the second precursor unit element p20' of FIG. 12C may be formed on the graphene layer GP1. The first and second metal elements M10 and M20 may be formed in dot patterns in the present embodiment. The first and second metal elements M10 and M20 may be randomly mixed to form an array. An array of the first and second metal elements M10 and M20 may constitute the metal nanopatterns NP15.

The metal nanopatterns NP15 may be a plasmonic nanostructure. The metal nanopatterns NP15 may be a factor that causes surface plasmon resonance. The structure including the graphene layer GP1 and the metal nanopatterns NP15 formed on the graphene layer GP1 may be usefully applied to various optical devices (optoelectronic devices).

FIGS. 13A through 13G are perspective views illustrating a method of manufacturing a nanostructure according to another embodiment.

Figure 13A:
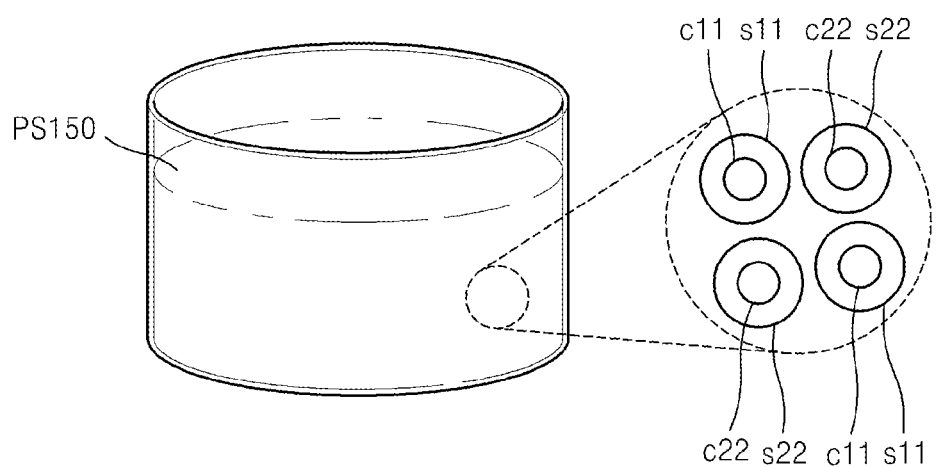
FIGS. 13A through 13G are perspective views illustrating a method of manufacturing a nanostructure, according to another embodiment.

Referring to FIG. 13A, a multi-component polymer solution PS150 may be prepared by dissolving a first block copolymer and a second block copolymer in a predetermined solvent. The first block copolymer may be, for example, PS-b-P2VP or PS-b-P4VP, and the second block copolymer may be, for example, PS-b-PEO. However, these specific materials of the first and second block copolymers are exemplary only, and other diverse materials may be used. The solvent may be a hydrophobic solvent. For example, the solvent may be toluene, a toluene/THF mixing solution, xylene, ethylbenzene, or the like. The multi-component polymer solution PS150 may include a plurality of first core portions c11 and first shell portions s11 each surrounding the first core portions c11, and a plurality of second core portions c22 and second shell portions s22 each surrounding the second core portions c22. The first core portions c11 may be formed by a hydrophilic second polymer of the first block copolymer. The second core portions c22 may be formed by a hydrophilic second polymer of the second block copolymer. The first and second shell portions s11 and s22 may be formed by hydrophobic first polymers of the first and second block copolymers. When the first block copolymer is PS-b-P2VP or PS-b-P4VP, and the second block copolymer is PS-b-PEO, both the first and second shell portions s11 and s22 may be formed from polystyrene (PS). In this case, the first and second shell portions s11 and s22 may be formed from substantially the same material (PS).

Figure 13B:
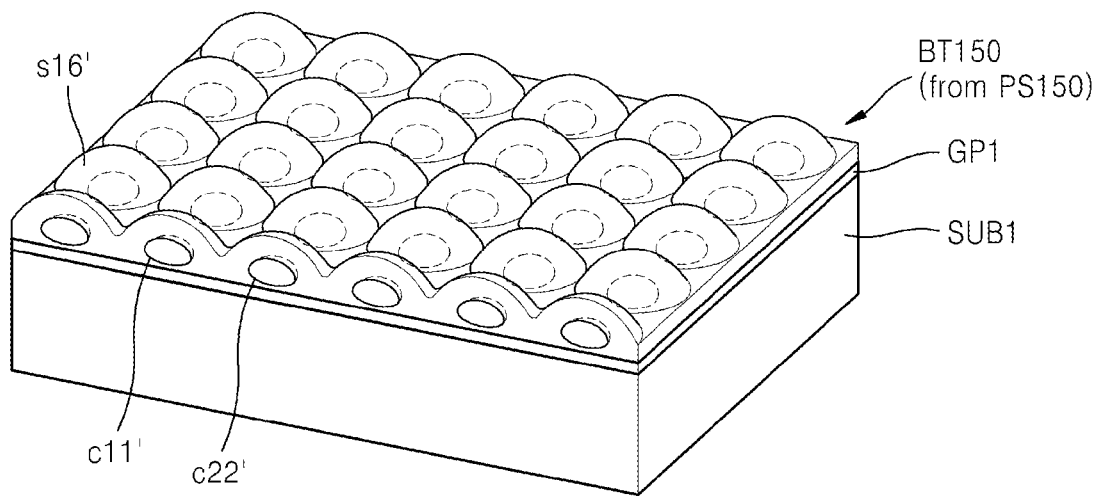

Referring to FIG. 13B, a block copolymer template layer BT150 may be formed by applying (e.g., coating) the multi-component polymer solution PS150 of FIG. 13A onto the graphene layer GP1 of FIG. 1A. The multi-component polymer solution PS150 of FIG. 13A may be applied onto the graphene layer GP1 by spin coating. The spin coating may be performed, for example, at a speed of from about 2000 to about 5000 rpm. After spin coating is performed, a drying process may be performed for several or several tens of minutes if necessary. The drying process may be performed at room temperature, for example, and in a nitrogen ($N_2$) or air atmosphere, for example. The above-formed block copolymer template layer BT150 may be a micelle film having a micelle structure. The block copolymer template layer BT150 may include a plurality of first core portions c11', a plurality of second core portions c22', and shell portions s16'. The shell portions s16' may be formed by combining the first shell portions s11 and the second shell portions s22 of FIG. 13A to form a single continuous layer. The plurality of first core portions c11' and the plurality of second core portions c22' may be randomly mixed.

Figure 13C:
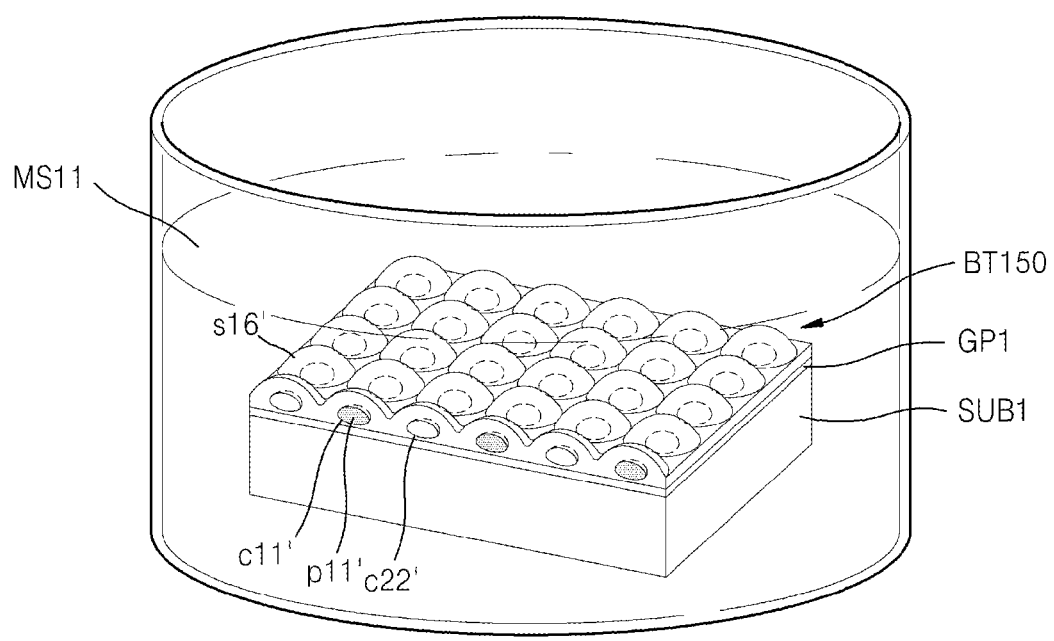

Referring to FIG. 13C, after a precursor solution of a first metal (hereinafter referred to as a first precursor solution) MS11 is prepared, the structure of FIG. 13B may be put into or immersed into the first precursor solution MS11. The first precursor solution MS11 may be manufactured by adding a precursor of the first metal to a predetermined solvent. In this regard, the first metal may be one selected from the group consisting of Au, Ag, Cu, Cr, Pt, Pd, and an alloy of these. As an example, when the first metal is Au, the precursor of the first metal may be, for example, $HAuCl_4$ or $LiAuCl_4$. The solvent of the first precursor solution MS11 may be an alcohol-based solvent. The alcohol-based solvent may be, for example, ethanol, methanol, or the like. However, according to the circumstances, water may be used instead of the alcohol-based solvent. As a specific example, the first precursor solution MS11 may be formed by adding $HAuCl_4$, which is a precursor of gold (Au), to ethanol. In such a case, $HAuCl_4$ may be added at a concentration of from about 0.1 to about 1 wt %. The substrate SUB1 on which the graphene layer GP1 and the block copolymer template layer BT150 are formed may be soaked in the first precursor solution MS11 for several or several tens of minutes.

If the substrate SUB1 on which the graphene layer GP1 and the block copolymer template layer BT150 are formed is soaked in the first precursor solution MS11, a precursor material of the first precursor solution MS11 may become coupled to the block copolymer template layer BT150. Here, the precursor material may be coupled to the first core portions c11' of the block copolymer template layer BT150. The precursor material of the first precursor solution MS11 may have a property whereby it may be selectively coupled to the first core portions c11' as measured against both the first and second core portions c11' and c22'. For example, when the first core portion c11' is P2VP or P4VP, and the precursor material in the first precursor solution MS11 is $HAuCl_4$ or $LiAuCl_4$, the $HAuCl_4$ or $LiAuCl_4$ may be selectively coupled to the P2VP or P4VP. Thus, the precursor material of the first precursor solution MS11 may be coupled to the first core portions c11'. The precursor material of the first precursor solution MS11 coupled to the first core portions c11' may thus configure a first precursor unit element p11'.

Figure 13D:
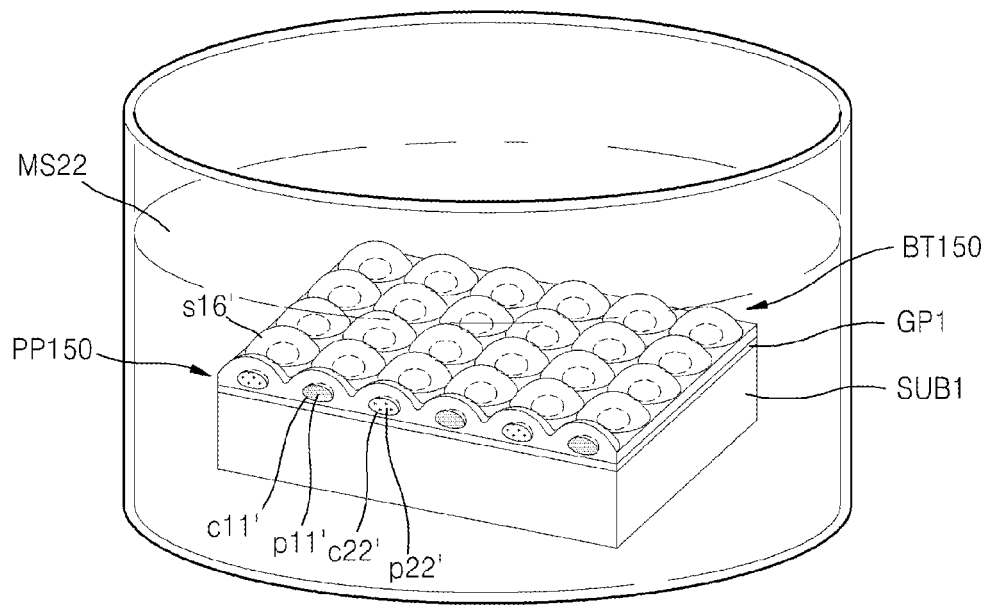

The substrate SUB1 on which the graphene layer GP1 and the block copolymer template layer BT150 are formed may be taken from the first precursor solution MS11, as shown in FIG. 13D, and may be soaked in a precursor solution of a second metal (hereinafter referred to as second precursor solution) MS22. The second precursor solution MS22 may be manufactured by adding a precursor of the second metal to a predetermined solvent. In this regard, the second metal may be one selected from the group consisting of Au, Ag, Cu, Cr, Pt, Pd, and an alloy of these, and may be metal that is different from the first metal. As an example, when the second metal is Ag, the precursor of the second metal may be, for example, $Ag(ClO)_4$. When the second metal is Cu, the precursor of the second metal may be, for example, $Cu(NO_3)_2$. The solvent of the second precursor solution MS22 may be an alcohol-based solvent. The alcohol-based solvent may use, for example, ethanol, methanol, or the like. However, according to the given circumstances, water may be used instead of the alcohol-based solvent. The substrate SUB1 on which the graphene layer GP1 and the block copolymer template layer BT150 are formed may be soaked in the second precursor solution MS22 for several or several tens of minutes.

If the substrate SUB1 on which the graphene layer GP1 and the block copolymer template layer BT150 are formed is soaked in the second precursor solution MS22, a precursor material of the second precursor solution MS22 may become coupled to the block copolymer template layer BT150. In this regard, the precursor material may be coupled to the second core portions c22' of the block copolymer template layer BT150. The first core portions c11' are already coupled to the precursor material of the first precursor solution MS11 during a previous process, and thus the precursor material of the second precursor solution MS22 may be coupled to the second core portions c22'. For example, when the second core portions c22' are PEO, and the precursor material of the second precursor solution MS22 is $Ag(ClO)_4$ or $Cu(NO_3)_2$, the Ag(ClO)$_4$ or Cu(NO$_3$)$_2$ may be coupled to the PEO. The precursor material of the second precursor solution MS22 coupled to the second core portions c22' may thus configure a second precursor unit element p22'.

Figure 13E:
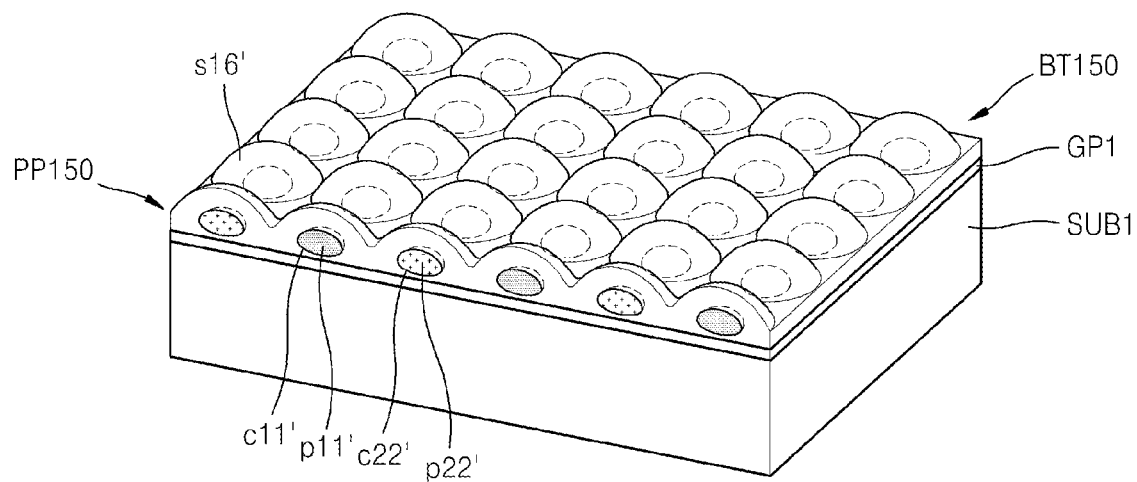

FIG. 13E shows the structure removed from the second precursor solution MS22 after the operation illustrated in FIG. 13D. In FIG. 13E, the first and second precursor elements p11' and p22' may configure multi-component metal precursor patterns PP150.

Through the process illustrated in FIGS. 13A through 13E, the multi-component block copolymer template layer BT150 and the multi-component metal precursor patterns PP150 coupled to the multi-component block copolymer template layer BT150 may be formed on the graphene layer GP1. The multi-component metal precursor patterns PP150 may be defined according to patterns of the multi-component block copolymer template layer BT150, i.e., patterns of the core portions c11' and c22'.

Figure 13F:
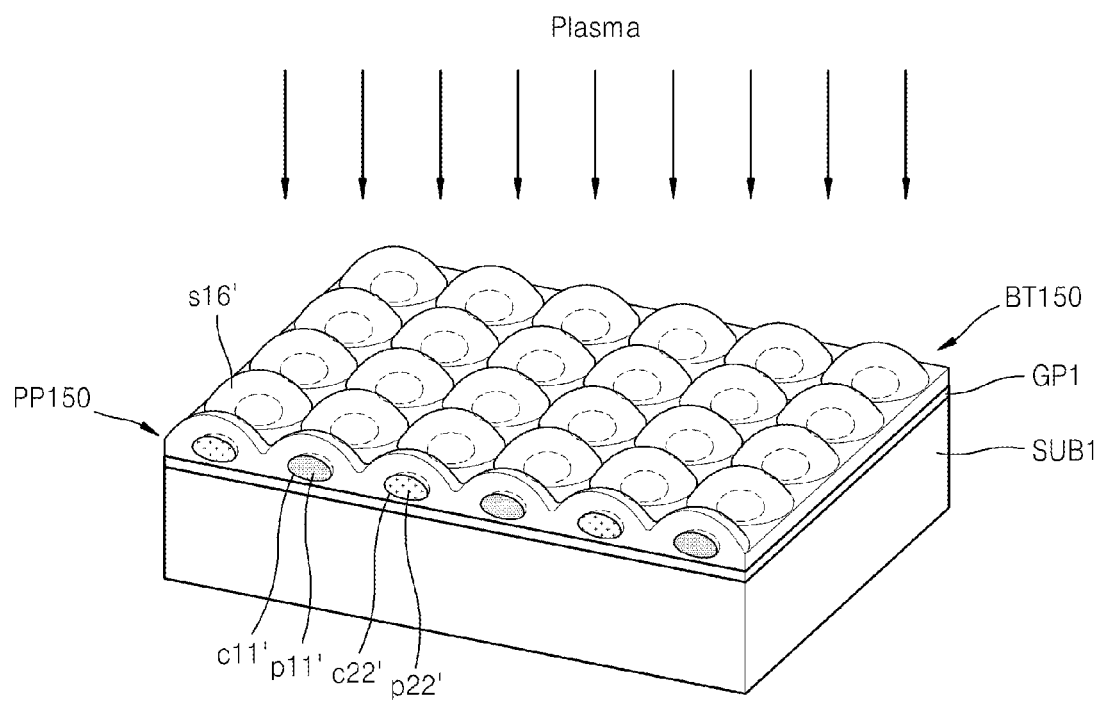

Referring to FIG. 13F, plasma treating (processing) may be performed on the multi-component block copolymer template layer BT150 and the multi-component metal precursor patterns PP150. The plasma treating (processing) may be the same as or similar to the plasma treating (processing) described with reference to FIG. 1F. Such plasma treating (processing) may remove the block copolymer template layer BT150, reduce the first and second precursor unit elements p11' and p22', and form the metal nanopatterns NP150 of FIG. 13G. The result of the plasma treating (processing) of FIG. 13F is shown in FIG. 13G.

Figure 13G:
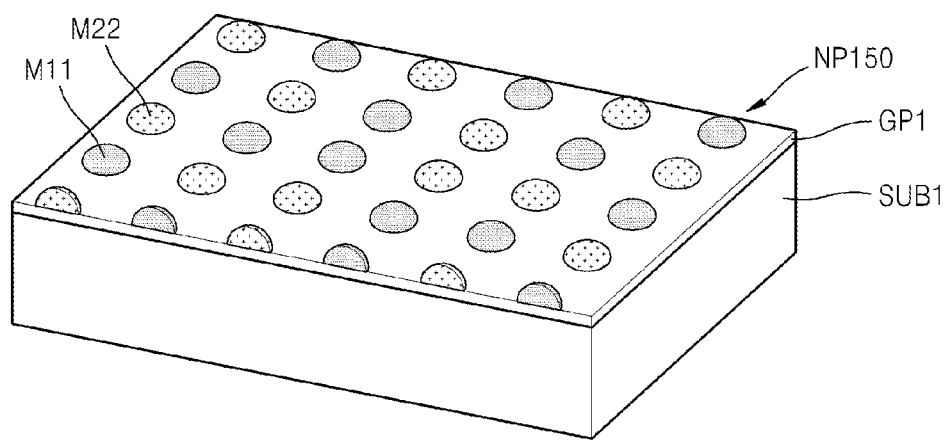

Referring to FIG. 13G, a first metal element (here, nanoparticles) M11 reduced from the first precursor unit element p11' of FIG. 13F may be formed on the graphene layer GP1. A second metal element (here, nanoparticles) M22 reduced from the second precursor unit element p22' of FIG. 13F may be formed on the graphene layer GP1. The first and second metal elements M11 and M22 may be formed in dot patterns in the present embodiment. The plurality of first and second metal nanoparticles M11 and M22 may be randomly mixed to form an array. An array of the first and second metal elements nanoparticles M11 and M22 may constitute the metal nanopatterns NP150.

The metal nanopatterns NP150 of FIG. 13G may be a plasmonic nanostructure. The metal nanopatterns NP150 may be a factor that causes surface plasmon resonance. The structure including the graphene layer GP1 and the metal nanopatterns NP150 formed on the graphene layer GP1 may be usefully applied to various optical devices (optoelectronic devices).

Figure 14:
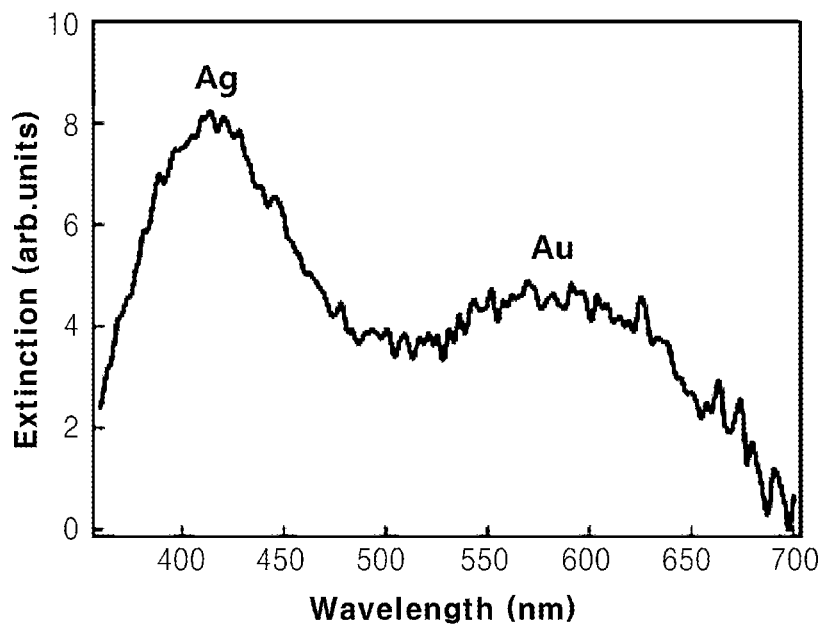
FIG. 14 is a graph showing a surface plasmon band of a multi-component metal nanopattern array manufactured according to an embodiment.

FIG. 14 is a graph showing a surface plasmon band of a multi-component metal nanopattern array manufactured according to an embodiment. The graph of FIG. 14 is a result with respect to a mixed array of the Ag dots and Au dots formed using the methods described with reference to FIGS. 12A through 12D.

Referring to FIG. 14, two peaks appear at a wavelength range of about 420 nm to about 580 nm. The peak at the wavelength of 420 nm concerns Ag dot patterns. The peak at the wavelength of 580 nm concerns Au dot patterns. These results show that the multi-component metal nanopatterns in which at least two different types of metal are mixed may be used as a multi-band plasmonic optical element.

According to another embodiment, a multi-component metal nanopattern array in which three or more types of metal nano elements are mixed may be formed by modifying the method described with reference to FIGS. 12A through 12D and the method described with reference to FIGS. 13A through 13G. In this case, a plasmonic optical element having a multi-band that is more than a triple band may be implemented. Also, a multi-component metal nanopattern array having a ring pattern may be formed by modifying the method described with reference to FIGS. 12A through 12D and the method described with reference to FIGS. 13A through 13G by using the method described with reference to FIGS. 3A through 3G.

A nanostructure according to an embodiment may be applied to various optical devices (such as optoelectronic devices) for various purposes. The nanostructure according to an embodiment and an optical device including the nanostructure will now be described with reference to FIGS. 15 and 16.

Figure 15:
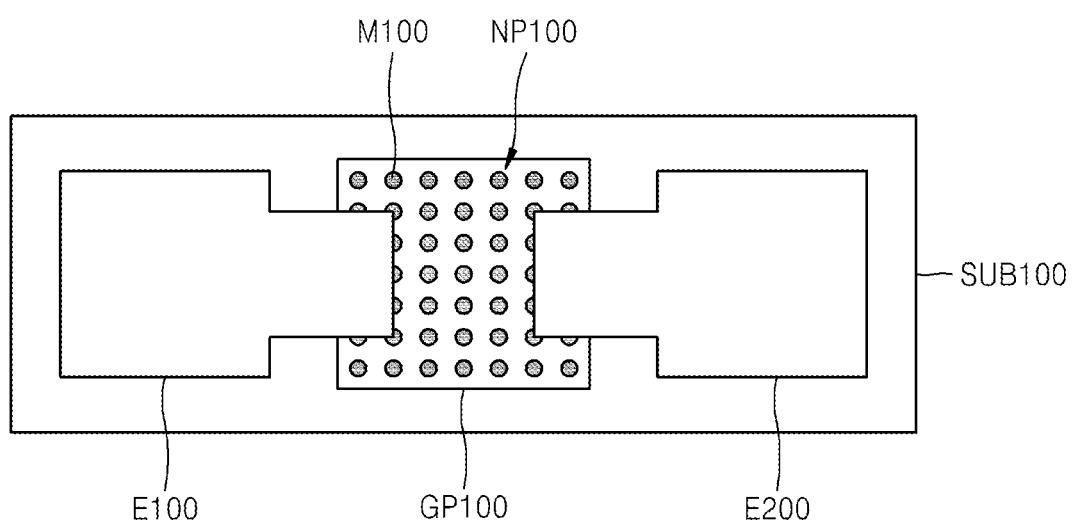
FIG. 15 is a plan view showing a nanostructure and a device (optical device) including the nanostructure, according to an embodiment.

FIG. 15 illustrates a nanostructure and a device (e.g., an optical device) including the nanostructure, according to an embodiment. The optical device of the present embodiment may be, for example, a photodetector. In this case, the optical device of the present embodiment may be a single band plasmonic photodetector.

Referring to FIG. 15, a graphene layer GP100 may be formed on a substrate SUB100, and a metal nanopattern NP100 may be formed on the graphene layer GP100. The metal nanopattern NP100 may include a plurality of metal elements M100. The graphene layer GP100 and the metal nanopattern NP100 may correspond to, for example, the graphene layer GP1 and the metal nanopattern NP1 of FIG. 1G, respectively. In this case, the metal nanopattern NP100 may be formed from a single metal material.

First and second electrodes E100 and E200 may be formed to respectively contact first and second regions of the graphene layer GP100 including the metal nanopattern NP100. One of the first and second electrodes E100 and E200 may be a source electrode, and another may be a drain electrode. The first and second electrodes E100 and E200 may be used to detect a photocurrent generated by light irradiated onto the graphene layer GP 100 and the metal nanopattern NP100.

Figure 16:
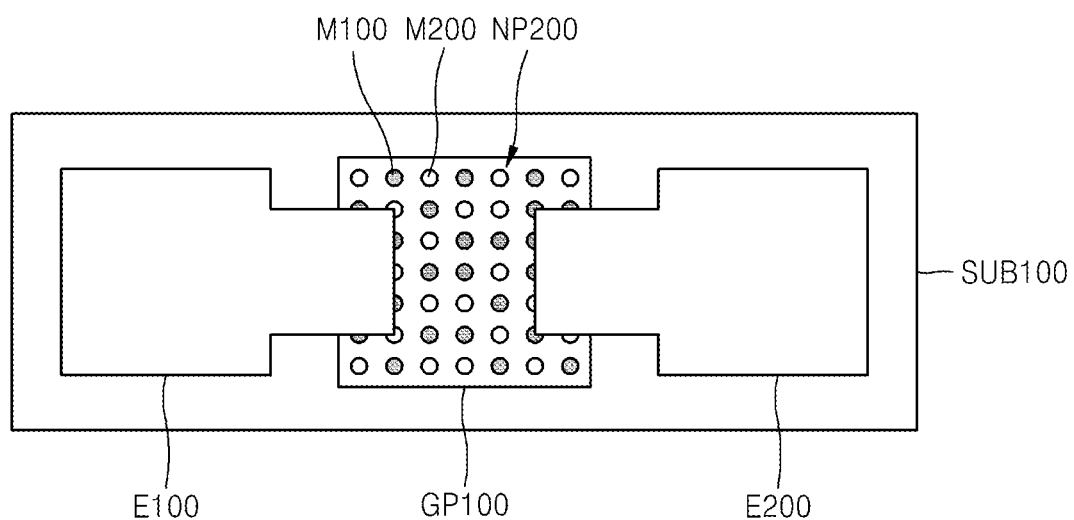
FIG. 16 is a plan view showing a nanostructure and a device (optical device) including the nanostructure, according to another embodiment.

FIG. 16 illustrates a nanostructure and a device (optical device) including the nanostructure according to another embodiment. The optical device of the present embodiment may be, for example, a photodetector. In this case, the optical device of the present embodiment may be a multi-band plasmonic photodetector.

Referring to FIG. 16, a multi-component metal nanopattern NP200 may be formed on the graphene layer GP100. The multi-component metal nanopattern NP200 may be formed from at least two different types of metal materials. For example, the multi-component metal nanopattern NP200 may include a first metal element M100 formed from a first metal and a second metal element M200 formed from a second metal. The graphene layer GP100 and the multi-component metal nanopattern NP200 may correspond to the graphene layer GP1 and the metal nanopattern NP15 of FIG. 12D, respectively.

First and second electrodes E100 and E200 may be formed to respectively contact first and second regions of the graphene layer GP100 including the multi-component metal nanopattern NP200. Similarly to the device of FIG. 15, the first and second electrodes E100 and E200 may be used to detect a photocurrent generated by light irradiated onto the graphene layer GP100 and the multi-component metal nanopattern NP200.

Although not shown in FIGS. 15 and 16, a gate for applying an electric field to the graphene layer GP100 and the multi-component metal nanopattern NP200 or metal nanopattern NP100 may be further provided. Characteristics of the graphene layer GP100 the multi-component metal nanopattern NP200, and metal nanopattern NP100 may be adjusted by applying the electric field to the graphene layer GP100, the multi-component metal nanopattern NP200, and metal nanopattern NP100 using the gate. As desired, a plurality of gates may be provided.

Figure 17A:
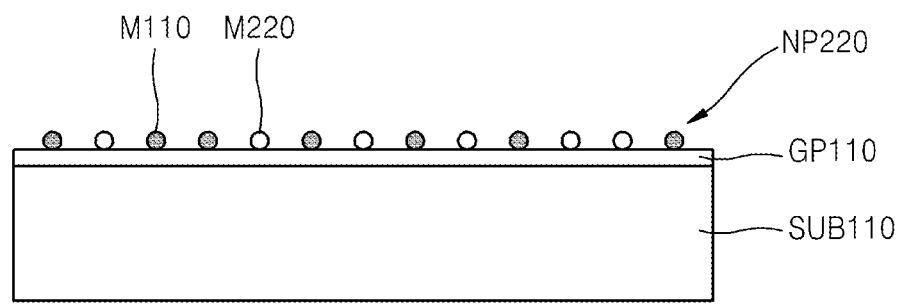
FIGS. 17A through 17C are cross-sectional views illustrating a method of manufacturing a device (optical device) including a nanostructure, according to another embodiment.
Figure 17B:
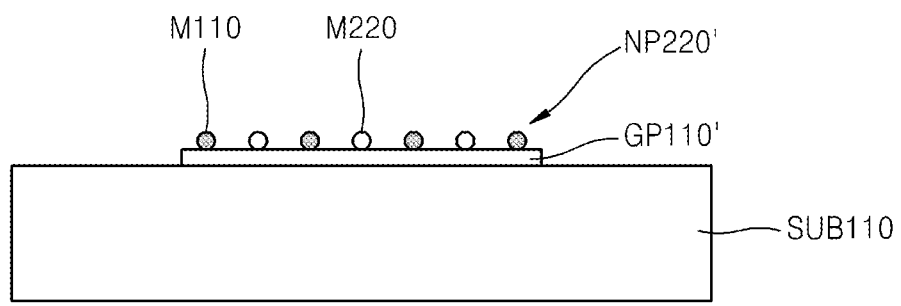
Figure 17C:
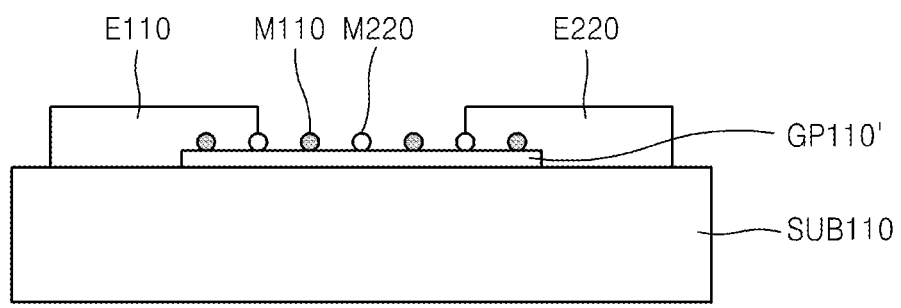

FIGS. 17A through 17C are cross-sectional views illustrating a method of manufacturing a device (e.g., an optical device) including a nanostructure, according to another embodiment.

Referring to FIG. 17A, a structure including a graphene layer GP110 formed on a substrate SUB110 and a metal nanopattern NP220 comprising metals M110 and M220 formed on the graphene layer GP1110 may be provided. The structure of FIG. 17A may be formed by using the method described with reference to FIGS. 12A through 12D or a modified method thereof. Thus, the substrate SUB110, the graphene layer GP110, and the metal nanopattern NP220 may correspond, respectively, to the substrate SUB1, the graphene layer GP1, and the metal nanopattern NP15 of FIG. 12D.

Referring to FIG. 17B, the graphene layer GP110 including the metal nanopattern NP220 may be patterned in a predetermined shape. Patterning may be performed, for example, by a general photolithography process. The patterned graphene layer GP110 and the patterned metal nanopattern NP220 may be referred to as GP110' and NP220', respectively.

Referring to FIG. 17C, first and second electrodes E110 and E220 may be formed to respectively contact first and second regions of the patterned graphene layer GP110'. The first and second electrodes E110 and E220 may, respectively, correspond to the first and second electrodes E100 and E200 of FIG. 15.

When the substrate SUB110 includes a conductive layer, the conductive layer may be used as a gate, if necessary. In this case, the substrate SUB110 may further include an insulation layer (i.e., a gate insulation layer) disposed between the conductive layer and the patterned graphene layer GP110'. Instead of using a part (e.g., the conductive layer) of the substrate SUB110 as the gate or along with such a gate, a gate may be further disposed above the patterned graphene layer GP110'. As may be desired, a plurality of gates may be disposed in one side of (e.g., above or below) the patterned graphene layer GP110'.

Figure 18:
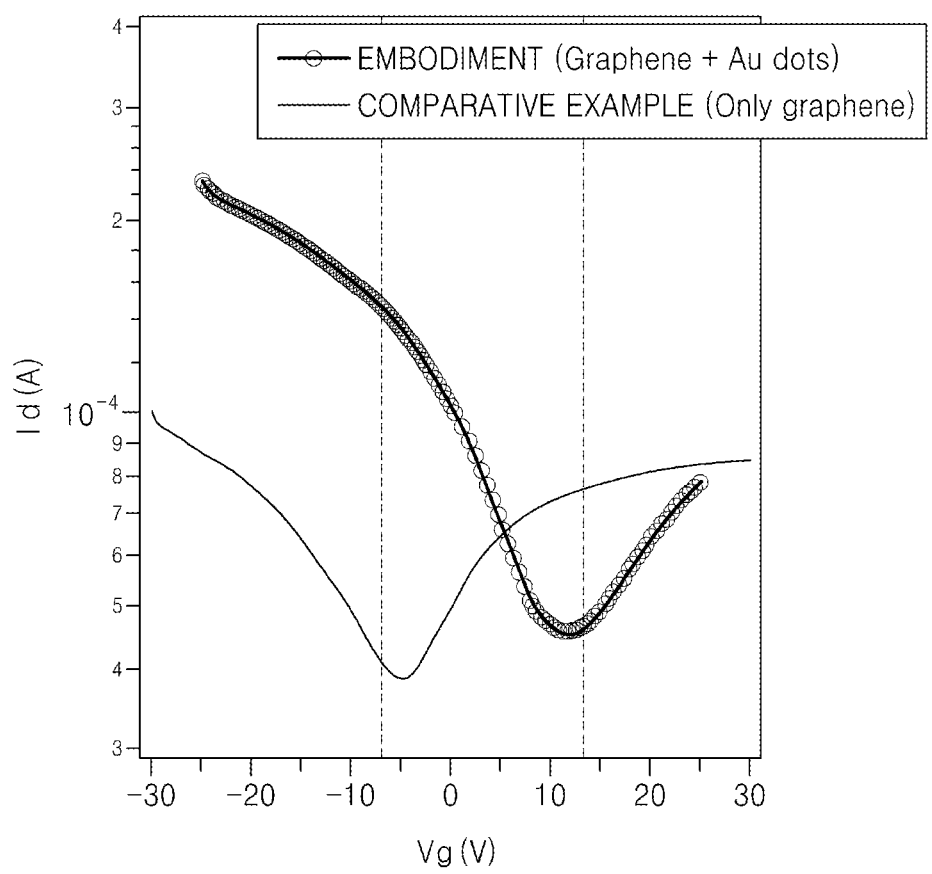
FIG. 18 is a graph showing transistor characteristic curves of devices according to an embodiment and a comparative example.
Figure 19A:
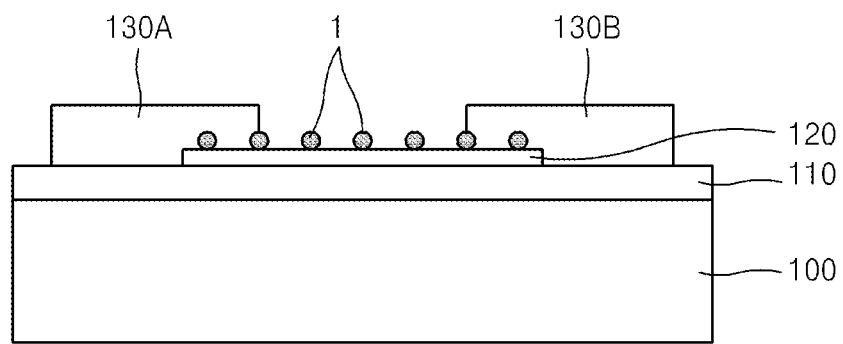
FIGS. 19A and 19B are cross-sectional views of devices according to an embodiment and a comparative example.
Figure 19B:
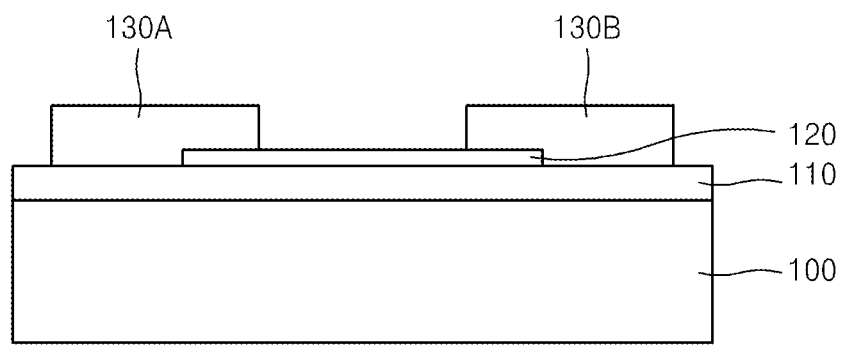

FIG. 18 is a graph showing transistor characteristic curves of devices according to an embodiment and a comparative example. The device according to the present embodiment may include a graphene layer 120, Au dots 1, first and second electrodes 130A and 130B, a gate 100, and a gate insulation layer 110 as shown in FIG. 19A. The device according to the comparative example may include the graphene layer 120, the first and second electrodes 130A and 130B, the gate 100, and the gate insulation layer 110 as shown in FIG. 19B. That is, the device according to the comparative example is different from the device according to the present embodiment in that the device according to the comparative example does not include Au dots.

Referring to FIG. 18, the graph shows that the transistor characteristic curve of the device according to the present embodiment is moved in a positive (+) direction compared to the transistor characteristic curve of the device according to the comparative example. The device according to the present embodiment includes an Au dot pattern so that a threshold voltage of a transistor may be moved in the positive (+) direction by a hole doping effect resulting from the Au dot pattern.

Figure 20:
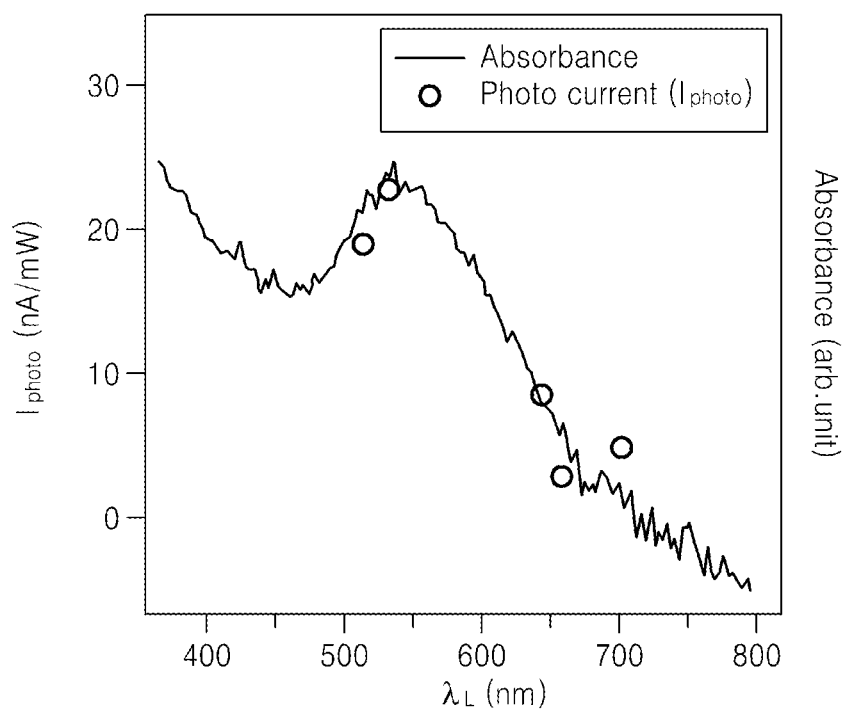
FIG. 20 is a graph showing an absorbance spectrum and photocurrent characteristics of a device according to an embodiment.

FIG. 20 is a graph showing an absorbance spectrum and photocurrent characteristics of a device according to an embodiment. Results of FIG. 20 are obtained from a device having a similar structure to the device of FIG. 19A. More specifically, the results of FIG. 20 are obtained from a device having a hybrid structure of a graphene layer and Au dots and two electrodes that contact the graphene layer and Au dots and are formed on a transparent substrate. To evaluate the photocurrent characteristic, the photocurrent generated by irradiating a laser beam (power: lower than 1 mW) on a contact portion (junction) of the graphene layer and the electrode (Cr/Au structure) is measured, and a photocurrent $I_{photo}$ (nA/mW) for unit energy is calculated by dividing a value of the measured photocurrent by power of the laser beam.

Referring to FIG. 20, the graph shows that a variation trend of the photocurrent (the photocurrent for unit energy) with respect to wavelengths is consistent with a variation trend of an absorbance spectrum. This result shows that the photocurrent is generated in the device of FIG. 19A by surface plasmon absorbance. Meanwhile, little photocurrent is generated in the device of FIG. 19B, i.e., a device having no metal dot pattern, and thus a characteristic evaluation consistent with FIG. 20 is almost impossible.

According to the above-described embodiments, properties of a carbon nanomaterial layer (for example, a graphene layer) and a block copolymer solution (i.e., a polymer solution) may be used to directly form a block copolymer template layer on the carbon nanomaterial layer. That is, the block copolymer template layer directly contacting the carbon nanomaterial layer may be formed without requiring an additional process of forming another material layer on the carbon nanomaterial layer or processing a surface of the carbon nanomaterial layer. Also, a hybrid structure including a metal nanoelement patterned on the carbon nanomaterial layer may be implemented by introducing (e.g., combining) various metal materials (plasmonic nanoelements) into a pattern having a functional group of the block copolymer template layer. The shape, size, and density of the metal nanoelement may be changed, and the location of a plasmon resonance peak/band may also be changed by changing the material and shape of the metal nanoelement. Thus, a surface plasmon peak may be adjusted from a region having a wavelength of about 400 nm to an infrared ray (IR) region by changing the material and shape of the metal nanoelement.

Furthermore, a multi-band/broad-band plasmonic optical device (e.g., a photodetector) may be manufactured by forming a multi-component metal nanopattern array using a multi-component block copolymer and a multi-component metal precursor.

Additionally, all processes according to the embodiments herein may be low temperature processes performed at room temperature or a temperature similar to room temperature, thereby easily applying to various polymer substrates. Therefore, a flexible substrate, a stretchable substrate, a transparent substrate, and the like, as well as a semiconductor substrate such as a silicon substrate, may be used, and various devices may be produced. Furthermore, no heating process, or needs to be, performed, thereby preventing the characteristics of the device from deteriorating due to heat.

While embodiments have been described above, they should be construed merely as examples, and should not be understood to limit the scope of the inventive concept. For example, it will be understood by those of ordinary skill in the art that various changes in the configurations of the methods of manufacturing the nanostructure illustrated in at least FIGS. 1A through 1G, 2A through 2D, 3A through 3G, 12A through 12D, and 13A through 13G, the structures of devices illustrated in FIGS. 15 and 16, and the methods of manufacturing the devices illustrated in FIGS. 17A through 17C, may be made. For example, a conductive material layer other than a graphene layer may be used, and a material other than metal may be used as the material of a nanoelement (e.g., a dot or ring). If necessary, the size of the nanoelement may be adjusted by using an electroless plating method. Additionally, the nanostructures according to the embodiments herein may be used in an optical device (for example, an optoelectronic device) other than a photodetector and an electronic device other than the optical device. Therefore, the scope of the inventive concept is not limited by the detailed description of the embodiments herein.

Similarly, it should be understood that the exemplary embodiments described herein are descriptive only and do not limit the inventive concept. Descriptions of features or aspects within each embodiment should typically be considered as being available for other similar features or aspects in other embodiments.

What is claimed is:

1. A method of manufacturing a nanostructure, the method comprising:
   preparing a graphene layer;
   forming a block copolymer template layer directly on the graphene layer and a precursor pattern of metal coupled to the block copolymer template layer; and
   forming a metal nanopattern on the graphene layer by removing the block copolymer template layer and reducing the precursor pattern.

2. The method of claim 1, wherein the forming the block copolymer template layer directly on the graphene layer comprises mixing a block copolymer, comprising a hydrophobic first polymer and a hydrophilic second polymer, and a hydrophobic solvent.

3. The method of claim 2, wherein the block copolymer comprises one of PS-b-P4VP, PS-b-P2VP, PS-b-PEO, PS-b-PAA, PI-b-P4VP, PI-b-P2VP, PI-b-PEO, PI-b-PAA, PMMA-b-P4VP, PMMA-b-P2VP, PMMA-b-PEO, PMMA-b-PAA, PS-b-PMA, PS-b-PMMA, PI-b-PMA, PI-b-PMMA, PMMA-b-PMA, PS-b-PS-OH, and PI-b-PS-OH.

4. The method of claim 2, wherein the hydrophobic solvent comprises one of toluene, a toluene/THF (tetrahydrofuran) mixing solution, xylene, and ethylbenzene.

5. The method of claim 1, wherein the block copolymer template layer and the precursor pattern of the metal are concurrently formed on the graphene layer.

6. The method of claim 5, wherein the forming the block copolymer template layer directly on the graphene layer and the precursor pattern of metal coupled to the block copolymer template layer comprises applying a polymer solution comprising a block copolymer and a precursor of metal on the graphene layer.

7. The method of claim 1, wherein the forming the precursor pattern of the metal comprises, after forming the block copolymer template layer directly on the graphene layer, soaking the block copolymer template layer in a precursor solution of metal.

8. The method of claim 1, wherein the removing the block copolymer template layer and the reducing of the precursor pattern comprise treating the block copolymer template layer and the precursor pattern with plasma.

9. The method of claim 1, wherein the block copolymer template layer has a micelle structure.

10. The method of claim 9, wherein the metal nanopattern is a dot pattern.

11. The method of claim 1, further comprising, after the forming the block copolymer template layer, modifying a shape of the block copolymer template layer, wherein the precursor pattern of the metal is coupled to the modified block copolymer template layer.

12. The method of claim 11, wherein the modifying the shape of the block copolymer template layer comprises:
    soaking the block copolymer template layer in an alcoholic based solvent; and
    drying the block copolymer template layer taken from the alcoholic based solvent.

13. The method of claim 11, wherein the block copolymer template layer has a micelle structure,
    wherein the modifying the shape of the block copolymer template layer comprises modifying the shape of the block copolymer template layer to have a porous structure.

14. The method of claim 11, wherein the metal nanopattern is a ring pattern.

15. The method of claim 1, wherein the metal nanopattern is a plasmonic nanostructure.

16. A method of manufacturing an optical device, the method comprising:
    forming a nanostructure including a metal nanopattern on a graphene layer by using the method of claim 1; and
    forming first and second electrodes contacting the nanostructure.

17. A method of manufacturing a nanostructure, the method comprising:
    preparing a graphene layer;
    forming a block copolymer template layer on the graphene layer;
    modifying a shape of the block copolymer template layer;
    forming a precursor pattern of metal coupled to the modified block copolymer template layer; and
    forming a metal nanopattern on the graphene layer by removing the block copolymer template layer and reducing the precursor pattern.

18. The method of claim 17, wherein the block copolymer template layer has a micelle structure, and
    wherein the modifying the shape of the block copolymer template layer comprises modifying the shape of the block copolymer template layer into a porous structure.

19. The method of claim 17, wherein the metal nanopattern is a ring pattern.

20. A method of manufacturing an optical device, the method comprising:
    forming a nanostructure including a metal nanopattern on a graphene layer by using the method of claim 17; and
    forming first and second electrodes contacting the nanostructure.

21. A method of manufacturing a nanostructure, the method comprising:
    preparing an underlayer;
    forming a multi-component block copolymer template layer and a multi-component metal precursor pattern coupled to the multi-component block copolymer template layer on the underlayer; and
    forming a multi-component metal nanopattern on the underlayer by removing the multi-component block copolymer template layer and reducing the multi-component metal precursor pattern.

22. The method of claim 21, wherein the underlayer comprises graphene.

23. The method of claim 21, wherein the forming the multi-component block copolymer template layer and the multi-component metal precursor pattern comprises:
    preparing a first solution comprising a first block copolymer and a first metal precursor coupled to the first block copolymer;

preparing a second solution comprising a second block copolymer and a second metal precursor coupled to the second block copolymer;

preparing a mixed solution by mixing the first solution and the second solution; and applying the mixed solution onto the underlayer.

24. The method of claim 21, wherein the forming the multi-component block copolymer template layer and the multi-component metal precursor pattern comprises:

preparing a multi-component polymer solution comprising a first block copolymer and a second block copolymer;

forming the multi-component block copolymer template layer by applying the multi-component polymer solution on the underlayer;

soaking the multi-component block copolymer template layer in a first precursor solution comprising a first metal precursor and coupling the first metal precursor to the multi-component block copolymer template layer; and soaking the multi-component block copolymer template layer in a second precursor solution comprising a second metal precursor and coupling the second metal precursor to the multi-component block copolymer template layer.

25. The method of claim 21, further comprising, after the forming the multi-component block copolymer template layer, modifying a shape of the multi-component block copolymer template layer, wherein the multi-component metal precursor pattern is coupled to the modified multi-component block copolymer template layer.

26. A method of manufacturing an optical device, the method comprising:

forming a nanostructure including a multi-component metal nanopattern on a graphene layer by using the method of claim 21; and forming first and second electrodes contacting the nanostructure.

27. An optical device comprising:

a carbon nanomaterial layer;

a multi-component metal nanopattern formed on the carbon nanomaterial layer; and first and second electrodes respectively contacting first and second regions of the carbon nanomaterial layer on which the multi-component metal nanopattern is formed.

28. The optical device of claim 27, wherein the carbon nanomaterial layer comprises graphene.

29. The optical device of claim 27, wherein the multi-component metal nanopattern has a mixed structure comprising a plurality of first nanostructures formed of a first metal and a plurality of second nanostructures formed of a second metal.

30. The optical device of claim 29, wherein the multi-component metal nanopattern is formed of three or more types of metal materials.

31. The optical device of claim 29, wherein the multi-component metal nanopattern is a dot pattern or a ring pattern.

* * * * *